United States Patent
Sato

(10) Patent No.: US 10,784,407 B2
(45) Date of Patent: Sep. 22, 2020

(54) NITRIDE SEMICONDUCTOR LIGHT EMITTING ELEMENT AND NITRIDE SEMICONDUCTOR LIGHT EMITTING DEVICE

(71) Applicant: ASAHI KASEI KABUSHIKI KAISHA, Tokyo (JP)

(72) Inventor: Kosuke Sato, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/299,678

(22) Filed: Mar. 12, 2019

(65) Prior Publication Data
US 2019/0326475 A1  Oct. 24, 2019

(30) Foreign Application Priority Data

Apr. 23, 2018 (JP) ................................. 2018-082346
Apr. 23, 2018 (JP) ................................. 2018-082347

(51) Int. Cl.
*H01L 33/38* (2010.01)
*H01L 33/32* (2010.01)
*H01L 33/62* (2010.01)

(52) U.S. Cl.
CPC ............ *H01L 33/387* (2013.01); *H01L 33/32* (2013.01); *H01L 33/38* (2013.01); *H01L 33/62* (2013.01); *H01L 33/382* (2013.01)

(58) Field of Classification Search
None
See application file for complete search history.

(56) References Cited

U.S. PATENT DOCUMENTS

| 2005/0211997 | A1 | 9/2005 | Suehiro et al. |
| 2008/0296573 | A1 | 12/2008 | Suehiro et al. |
| 2009/0140280 | A1* | 6/2009 | Shen ............... H01L 33/20 257/98 |
| 2013/0207153 | A1 | 8/2013 | Kamiya et al. |

(Continued)

FOREIGN PATENT DOCUMENTS

| JP | 2006-066868 A | 3/2006 |
| JP | 2007-287912 A | 11/2007 |

(Continued)

*Primary Examiner* — Steven B Gauthier
(74) *Attorney, Agent, or Firm* — Morgan, Lewis & Bockius LLP

(57) ABSTRACT

A nitride semiconductor light emitting element includes a first nitride semiconductor layer of a first conductivity type, nitride semiconductor stacked bodies each of which is formed on a portion of the first nitride semiconductor layer and includes a nitride semiconductor light emitting layer and a second nitride semiconductor layer of a second conductivity type, first electrodes formed on the first nitride semiconductor layer, and second electrodes each of which is formed on the second nitride semiconductor layers of the nitride semiconductor stacked bodies. The first and the second electrodes extend in a first direction. The first and the second electrodes are arranged in parallel with one another with gaps interposed therebetween in a second direction perpendicular to the first direction in plan view. A dimension of first electrodes sandwiched by second electrodes is greater than a dimension of first electrodes not sandwiched by second electrodes in the second direction.

21 Claims, 25 Drawing Sheets

(56) References Cited

U.S. PATENT DOCUMENTS

| | | |
|---|---|---|
| 2014/0291714 A1 | 10/2014 | Jeon et al. |
| 2015/0270442 A1 | 9/2015 | Chae et al. |
| 2016/0064611 A1 | 3/2016 | Choi et al. |
| 2017/0263817 A1 | 9/2017 | Hirano et al. |

FOREIGN PATENT DOCUMENTS

| | | |
|---|---|---|
| JP | 2008-108905 A | 5/2008 |
| JP | 2011-258673 A | 12/2011 |
| JP | 2012-134421 A | 7/2012 |
| JP | 2013-168444 A | 8/2013 |
| JP | 2014-096460 A | 5/2014 |
| JP | 2016-058689 A | 4/2016 |
| JP | 5985782 B1 | 8/2016 |
| JP | 2016-181674 A | 10/2016 |

\* cited by examiner

NITRIDE SEMICONDUCTOR LIGHT EMITTING ELEMENT AND NITRIDE SEMICONDUCTOR LIGHT EMITTING DEVICE

TECHNICAL FIELD

The present invention relates to a nitride semiconductor light emitting element and a nitride semiconductor light emitting device including the same.

BACKGROUND ART

A nitride semiconductor light emitting element is, for example, constituted by a substrate, an n-type nitride semiconductor layer formed on the substrate, a nitride semiconductor stacked body (a mesa portion including a nitride semiconductor light emitting layer and a p-type nitride semiconductor layer) formed on a portion of the n-type nitride semiconductor layer, an n-type electrode formed on the n-type nitride semiconductor layer, and a p-type electrode formed on the p-type nitride semiconductor layer of the nitride semiconductor stacked body.

PTL 1 describes shaping a planar shape of a mesa portion (first region) of a nitride semiconductor light emitting element into a shape having recessed portions each of which surrounds a second region (a region other than the first region) from three directions and a planar shape of the second region into a shape in which recessed-portion regions each of which is surrounded by a recessed portion of the first region and a region (peripheral region) other than the recessed-portion regions are continuously connected. PTL 1 also describes forming an n-type electrode on an n-type semiconductor layer in the second region in such a manner that the n-type electrode extends over the recessed-portion regions and the peripheral region and a p-type electrode on the top surface of a p-type semiconductor layer. Further, the n-type electrode is formed in such a way that the outer shape line of the n-type electrode extends along the outer shape line of the mesa portion with a constant gap interposed therebetween in plan view.

Nitride semiconductor light emitting elements have been required to emit light uniformly within the active region in order to increase external quantum efficiency of the nitride semiconductor light emitting elements. Causes for non-uniformity in the amount of emitted light include existence, in the element, of a portion on which current flowing between a p-type electrode and an n-type electrode concentrates.

As a countermeasure against the problem, PTL 2 proposes suppressing current concentration without reducing light emission area by forming a p-type electrode in such a way as to cover a p-type semiconductor layer in a planar manner and forming a high resistance layer, having a higher resistance than the p-type semiconductor layer or the p-type electrode, on the surface of the p-type semiconductor layer in a shape extending on the side close to an n-type electrode along the shape of the p-type semiconductor layer side of the n-type electrode.

CITATION LIST

Patent Literature

PTL 1: JP 5985782 B
PTL 2: JP 2014-96460 A

SUMMARY OF INVENTION

Technical Problem

The nitride semiconductor light emitting element described in PTL 1 does not have a configuration with suppression of current concentration considered.

The nitride semiconductor light emitting element described in PTL 2, because of having a high resistance layer formed therein in order to suppress current concentration, has a problem in that a manufacturing cost increases.

A problem to be solved by the present invention is to provide a nitride semiconductor light emitting element in which current concentration is suppressed at a low cost.

Solution to Problem

In order to solve the problem described above, a nitride semiconductor light emitting element of one aspect of the present invention has the following configuration requirements (a) to (c):
(a) the nitride semiconductor light emitting element includes a first nitride semiconductor layer of a first conductivity type, nitride semiconductor stacked bodies (mesa portions) each of which is formed on a portion of the first nitride semiconductor layer and includes a nitride semiconductor light emitting layer and a second nitride semiconductor layer of a second conductivity type, a plurality of first electrodes each of which is formed on the first nitride semiconductor layer and extends in a first direction, and a plurality of second electrodes each of which is formed on one of the second nitride semiconductor layers of the nitride semiconductor stacked bodies and extends in the first direction;
(b) the first electrodes and the second electrodes are arranged alongside with one another with gaps interposed therebetween in a second direction perpendicular to the first direction in plan view; and
(c) a first electrode sandwiched by second electrodes and a first electrode not sandwiched by second electrodes exist and a dimension in the second direction of the first electrode sandwiched by second electrodes is greater than a dimension in the second direction of the first electrode not sandwiched by second electrodes.

Advantageous Effects of Invention

A nitride semiconductor light emitting element of the present invention is a nitride semiconductor light emitting element that is expected to suppress current concentration and can be provided at a low cost.

DESCRIPTION OF EMBODIMENTS

Figure 1:
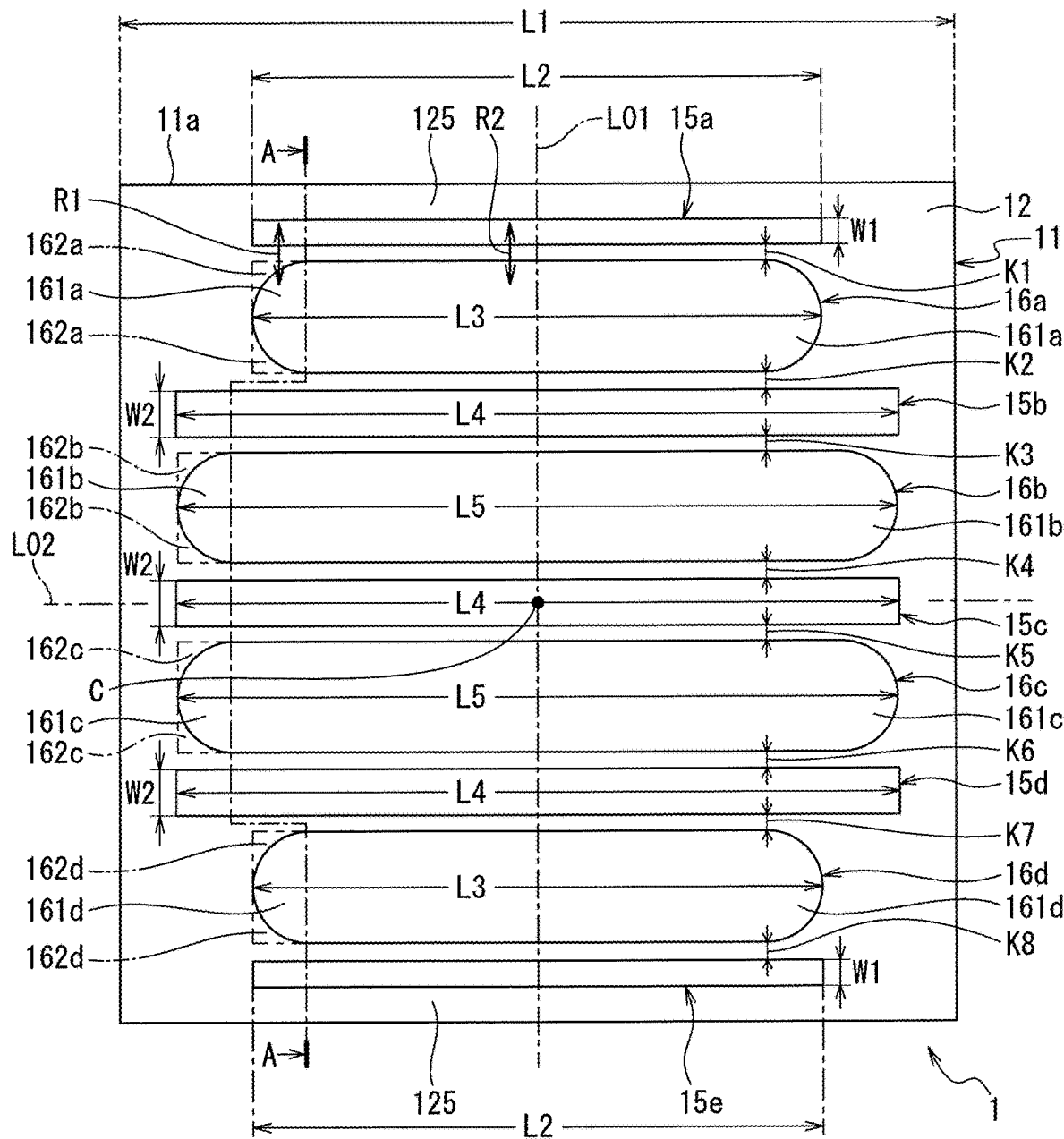
FIG. 1 is a plan view descriptive of a first example of a nitride semiconductor light emitting element of the present invention.

[Nitride Semiconductor Light Emitting Element of One Aspect]

While a nitride semiconductor light emitting element of one aspect has the configuration requirements (a) to (c) described above, it is considered that the nitride semiconductor light emitting element having at least one or more of the following configuration requirements (d) to (j) enables suppression effect against current concentration to be increased to a higher level than in a case of not having any of the configuration requirements:

(d) a dimension in a first direction of a first electrode that is sandwiched by second electrodes is greater than or equal to a dimension in the first direction of a first electrode that is not sandwiched by second electrodes;

(e) at least one of a plurality of second electrodes has, at end portions in the first direction thereof, portions where distances from a first electrode arranged next thereto gradually increase toward the tips thereof;

(f) the nitride semiconductor light emitting element has an electrode pair that is made up of a first electrode and a second electrode that are arranged next to each other in a second direction and in which a dimension in the first direction of the first electrode is longer than a dimension in the first direction of the second electrode, and end portions in the first direction of the second electrode in the electrode pair have, on the side of the second electrode where the first electrode in the electrode pair is arranged, portions where distances from the first electrode arranged next to the second electrode gradually increase toward the tips thereof;

(g) a first nitride semiconductor layer has a rectangular planar shape, the first direction and the long sides of the above-described rectangle are parallel or substantially parallel with each other, and the nitride semiconductor light emitting element satisfies at least either the formula (1) below that expresses a relationship between a dimension L1 of the long sides of the above-described rectangle and a dimension L2 in the first direction of a first electrode not sandwiched by second electrodes or the formula (2) below that expresses a relationship between the dimension L1 of the long sides of the above-described rectangle and a dimension L3 in the first direction of a second electrode arranged next to a first electrode not sandwiched by second electrodes:

$$140 \text{ μm} < L1-L2 < 650 \text{ μm} \tag{1}$$

$$140 \text{ μm} < L1-L3 < 650 \text{ μm} \tag{2}$$

(h) the first nitride semiconductor layer has a planar shape of a rectangle, the first direction and the long sides of the above-described rectangle are parallel or substantially parallel with each other, and an absolute value of a difference between the dimension L2 in the first direction of a first electrode not sandwiched by second electrodes and a dimension L4 in the first direction of a first electrode sandwiched by second electrodes is greater than 0 and less than 500 μm;

(i) the first nitride semiconductor layer has a planar shape of a rectangle, the first direction and the long sides of the above-described rectangle are parallel or substantially parallel with each other, and an absolute value of a difference between the dimension L3 in the first direction of a second electrode arranged next to a first electrode not sandwiched by second electrodes and a dimension L5 in the first direction of a second electrode arranged between a first electrode sandwiched by second electrodes and another first electrode sandwiched by second electrodes is greater than 0 and less than 500 µm; and (j) resistance values between a first electrode not sandwiched by second electrodes and a second electrode arranged next to the first electrode are practically identical at both end portions and a middle portion in the first direction.

[Nitride Semiconductor Light Emitting Device of One Aspect]

[Configuration]

A nitride semiconductor light emitting device of one aspect of the present invention has the following configurations (k) to (n). That is, the nitride semiconductor light emitting device includes:

(k) a nitride semiconductor light emitting element that is a nitride semiconductor light emitting element of the one aspect described above and that includes a wiring layer formed on first electrodes;

(l) a base body on a surface of which facing a surface of the nitride semiconductor light emitting element on which first electrodes and second electrodes are formed, a third electrode and a fourth electrode are formed;

(m) a first connecting body configured to electrically connects a wiring layer formed on the first electrodes of the nitride semiconductor light emitting element and the third electrode of the base body to each other; and (n) second connecting bodies configured to electrically connect the second electrodes of the nitride semiconductor light emitting element and the fourth electrode of the base body to each other.

Advantageous Effects

The nitride semiconductor light emitting device of the one aspect can be expected to be a nitride semiconductor light emitting device that is unlikely to cause a short-circuit defect and has high reliability and, in conjunction therewith, can be expected to improve heat radiation effect by having a wiring layer.

[Manufacturing Method]

Manufacturing methods of the nitride semiconductor light emitting device of the one aspect include a method that has the following configuration requirements (1) to (5) and a method that has the following configuration requirements (1), (2), and (6) to (10):

(1) the manufacturing method is a manufacturing method of a nitride semiconductor light emitting device in which the first electrodes and the second electrodes formed on the nitride semiconductor light emitting element and the third electrode and the fourth electrode formed on the base body are electrically connected using the first connecting bodies and the second connecting bodies, respectively;

(2) the manufacturing method includes a step in which the first electrodes and the second electrodes are formed on the first nitride semiconductor layer and the second nitride semiconductor layers of the nitride semiconductor light emitting element, respectively;

(3) the manufacturing method includes a step in which the wiring layer is formed on the first electrodes of the nitride semiconductor light emitting element;

(4) the manufacturing method includes a step in which the first connecting bodies and the second connecting bodies are formed on the wiring layer and the second electrodes, respectively;

(5) the manufacturing method includes a step in which the first connecting bodies and the second connecting bodies are fixed to the third electrode and the fourth electrode of the base body, respectively;

(6) the manufacturing method includes a step in which the insulating layer is formed on the first nitride semiconductor layer, the second nitride semiconductor layers, the first electrodes, and the second electrodes after the above-described step (2);

(7) the manufacturing method includes an exposure step in which a portion of the insulating layer is removed and the first electrodes and the second electrodes are exposed; (8) the manufacturing method includes a step in which the wiring layer is formed on the first electrodes after the exposure step;

(9) the manufacturing method includes a step in which the first connecting bodies and the second connecting bodies are formed on the wiring layer and the second electrodes, respectively; and

(10) the manufacturing method includes a step in which the first connecting bodies and the second connecting bodies are fixed to the third electrode and the fourth electrode of the base body, respectively.

[Wiring Layer]

In the nitride semiconductor light emitting device of the one aspect, the wiring layer electrically connects the first electrodes and the first connecting bodies to each other. The wiring layer also serves as a heat radiation path when heat generated in the nitride semiconductor light emitting element is radiated to the outside. A material of which the wiring layer is made may be a material different from or the same material as that of the first electrodes. When the material of which the wiring layer is made is the same material as that of the first electrodes, portions in contact with the nitride semiconductor layer are defined as the first electrodes and a continuously extending portion connecting surfaces in contact with the first connecting bodies to surfaces in contact with the first electrodes is defined as the wiring layer.

It is preferable to use, as a material of the wiring layer, a metallic material, such as Au, Ag, Al, Cu, W, Mo, Ni, Pt, and Cr, which has a high conductivity and is unlikely to deteriorate due to oxygen or humidity. An oxide conductive material, such as ITO and IZO, a conductive carbon paste material, and a solder material, such as tin and lead, can also be used. When the nitride semiconductor light emitting element, as a pin light emitting element, has a structure that includes an n-type nitride semiconductor layer and a p-type nitride semiconductor layer and in which electrical contact between the materials may cause a leakage defect, it is preferable that a wiring layer in electrical contact with n-type electrodes and a wiring layer in electrical contact with p-type electrodes be arranged only on the n-type nitride semiconductor layer and the p-type nitride semiconductor layer, respectively.

Forming of the wiring layer, as with the forming method of electrodes described above, can be performed using a general semiconductor manufacturing apparatus. From the viewpoint of being capable of forming a metal layer having a high purity, it is preferable to use a vapor deposition method.

The wiring layer may be formed on not only the first electrodes but also the second electrodes.

[Relationship Between Portions of Wiring Layer on which First Connecting Bodies are Formed and Nitride Semiconductor Layer]

In the nitride semiconductor light emitting device of the one aspect, the wiring layer is electrically and thermally in contact with the first connecting bodies. Reverse sides of sites of the wiring layer, the sites being in contact with the first connecting bodies, may be in direct contact with the nitride semiconductor layer, or an insulating layer may exist between the above-described reverse sides and the nitride semiconductor layer. Alternatively, an adhesion layer may exist between the above-described reverse sides and the nitride semiconductor layer or the insulating layer.

That is, the nitride semiconductor light emitting device of the one aspect can have any of the following configurations (o), (p), and (q):

(o) the nitride semiconductor light emitting element has an insulating layer that is formed between the wiring layer and the nitride semiconductor layer, and reverse sides of sites of the wiring layer, the sites being in contact with the first connecting bodies, are in contact with the nitride semiconductor layer or the insulating layer;

(p) the reverse sides of the sites of the wiring layer, the sites being in contact with the first connecting bodies, are in contact with the nitride semiconductor layer; and (q) the nitride semiconductor light emitting element has an adhesion layer between portions of the wiring layer on which the first connecting bodies are formed and the nitride semiconductor layer or the insulating layer.

It is preferable to use, as a material of the adhesion layer, a metallic material, such as Ti, Ni, V, and Zr. From the viewpoint of adhering the wiring layer and the nitride semiconductor layer to each other easily and solidly, it is preferable to use a material containing at least either Ti or Ni, and most preferable to use a material containing Ti. In order to suppress current from flowing from the adhesion layer to the nitride semiconductor layer, it is preferable that the adhesion layer be formed of a material constituted by a substance or in a composition different from that of the electrodes.

When the adhesion layer and the electrodes are formed of the same material, it is preferable that composition distribution or film thickness distribution in plan view be different between the adhesion layer and the electrodes in order to differentiate contact resistance with the nitride semiconductor layer between the adhesion layer and the electrodes. The composition distribution or the film thickness distribution can be differentiated between the electrodes and the adhesion layer by changing heat processing conditions between the electrodes and the adhesion layer after having formed the material in a layered manner. The composition distribution and the film thickness distribution can be obtained by, for example, comparing composition ratios through performing cross-section SEM and EDX analysis or comparing film thickness ratios through measuring film thickness.

The nitride semiconductor light emitting element constituting the nitride semiconductor light emitting device of the one aspect may have regions in which the nitride semiconductor layer is not formed in regions in which no electrode is formed, in plan view. In this case, in the one aspect, a structure can be employed in which the wiring layer is continuously formed to the regions in which the nitride semiconductor layer is not formed and the first connecting bodies are formed in the regions. That is, the nitride semiconductor light emitting device of the one aspect can have the following configuration (r):

(r) portions of the wiring layer on which the first connecting bodies are formed exist at positions off the nitride semiconductor layer in plan view.

This configuration enables current to be suppressed from directly flowing from the wiring layer to the nitride semiconductor layer as compared with a case where the configuration (p) is employed. In addition, it is preferable to dispose an insulating layer between portions of the wiring layer formed in the regions in which the nitride semiconductor layer is not formed and the nitride semiconductor layer. Since this configuration causes a current injection path to the nitride semiconductor layer to be restricted to the first electrodes, a current distribution intended at the time of designing a first electrode pattern can be achieved.

[Insulating Layer]

As for the nitride semiconductor light emitting element constituting the nitride semiconductor light emitting device of the one aspect, there is a case where an insulating layer is arranged between the wiring layer and the nitride semiconductor layer (for example, a case where the nitride semiconductor light emitting element has the configuration (h)) with the aim of suppressing current from flowing between the nitride semiconductor layer and the wiring layer. Examples of a material of which the insulating layer is made include oxides or nitrides, such as $SiO_2$, SiN, SiON, and $Al_2O_3$, but are not limited thereto. In particular, $SiO_2$ or SiN is preferable because a forming process thereof is simple. In addition, the insulating layer may be single-layered or have a multilayer structure in which a plurality of materials are layered.

When breakdown voltage of a material constituting the insulating layer and thickness of the insulating layer are denoted by E and d, respectively, withstand voltage of the insulating layer is expressed by Ed. When a potential difference between the nitride semiconductor layer in contact with one surface of the insulating layer and the wiring layer (wiring over the chip) in contact with the other surface of the insulating layer is greater than Ed described above, an insulation breakdown occurs and causes the nitride semiconductor layer and the wiring layer to be electrically connected to each other. Since, in that case, an unintended current path is formed in the nitride semiconductor layer, current flow is unevenly distributed, and an element defect, such as a local breakdown at the time of turn-on, is caused, it is required to set Ed greater than the potential difference.

Effect attainable by disposing an insulating layer between the nitride semiconductor layer and the wiring layer is large in an ultraviolet light emitting element, which requires large current for achieving high output, and an on-vehicle semiconductor transistor and the like, which are required to achieve stable characteristics even under high temperature conditions.

In a nitride semiconductor light emitting element using an AlGaN layer as a nitride semiconductor layer, a value of Ed is preferably greater than 10 V and more preferably greater than 20 V. When the insulating layer is constituted as a multilayer structure, the sum of values of Ed calculated for respective layers is preferably greater than 10 V.

Since, in the nitride semiconductor light emitting element constituting the nitride semiconductor light emitting device of the one aspect, the insulating layer formed between the wiring layer and the nitride semiconductor layer is the target of consideration, a value of Ed is calculated using a thickness at a thinnest portion of the insulating layer as a "thickness d of the insulating layer" and a physical property value generally used by those skilled in the art for a material of the insulating layer as a breakdown voltage E of the insulating layer.

The nitride semiconductor light emitting element constituting the nitride semiconductor light emitting device of the one aspect is protected from static electricity, water, physical shocks, and the like because the surface of the nitride semiconductor layer is covered by the insulating layer.

Forming of the insulating layer can be performed using a general semiconductor manufacturing apparatus. Examples of such a semiconductor manufacturing apparatus include a plasma chemical vapor deposition apparatus (plasma CVD), which film-forms an insulating layer on a nitride semiconductor thin film, a sputtering apparatus, which film-forms an insulating layer by means of sputtering a raw material, and a vapor deposition apparatus, which vaporize a raw material by means of heat or electron beam and film-forms an insulating layer using the vaporized raw material.

The insulating layer may be formed on the whole surface of the nitride semiconductor layer except portions where the electrodes are exposed, or regions where the insulating layer is not formed may be disposed to portions other than the above-described portions and the wiring layer may be disposed to the regions.

[First and Second Connecting Bodies]

Examples of a material of the first connecting bodies and the second connecting bodies (hereinafter, the first and second connecting bodies are also collectively referred to as "connecting bodies") include metals, such as Pb, Al, Cu, Ag, and Au, and an alloy thereof. Among the above-described materials, it is preferable to use a material containing Au because of high thermal conductivity, excellent corrosion resistance, and ease of bonding. It is more preferable that a principal component of the connecting bodies be Au. Note that the description "a principal component is Au" means that a component contained in a largest amount is Au.

Although there is no specific limitation to a forming method of connecting bodies, examples of the forming method include a method of melting metal wire using heat, ultrasonic waves, or both thereof and fixing one end of the metal wire to an electrode and a method of depositing Au by means of an electroless plating method. A shape of a connecting body may be a columnar, spherical, or other shape. Examples of a connecting body include a gold plated body and a gold ball.

[Relationship in Dimension Between Connecting Body and Electrode]

While there exist a plurality of lines passing through the centroid of a target planar shape and each of such lines contains a line segment overlapping the target planar shape, length of a shortest line segment and length of a longest line segment among the line segments are defined as a "short diameter in plan view" and a "long diameter in plan view", respectively, herein. In the nitride semiconductor light emitting device of the one aspect, short diameters in plan view of a first electrode and a first connecting body are denoted by $x1$ and $x2$, respectively.

It is preferable that the short diameters $x1$ and $x2$ in plan view of a first electrode and a first connecting body satisfy $x2>x1$. While the first connecting bodies are connected to the wiring layer electrically and thermally, satisfying $x2>x1$ enables current and heat to be avoided from locally concentrating within the first connecting bodies. In this respect, it is preferable that the short diameters $x1$ and $x2$ satisfy $0$ $\mu m<x1<50$ $\mu m$ and $x1<x2<200$ $\mu m$, respectively. It is more preferable that the short diameters $x1$ and $x2$ satisfy $0$ $\mu m<x1<x2<50$ $\mu m$, and further more preferable that the short diameters $x1$ and $x2$ satisfy $0$ $\mu m<x1<x2<30$ $\mu m$.

When the nitride semiconductor light emitting element includes a plurality of first electrodes, it is preferable that the short diameters $x1$ in plan view of all the first electrodes be less than the short diameter $x2$ in plan view of the first connecting body.

From the viewpoint of physical strength when the respective connection bodies are formed on the first electrodes and the second electrodes, it is preferable that height (distance between the element side electrode and the base body side electrode) $z2$ of each connecting body be greater than the short diameter $x2$ or the long diameter $y2$ in plan view of the connecting body.

The number of first connecting bodies and the number of second connecting bodies may respectively be one or plural.

When the nitride semiconductor light emitting element has a plurality of first electrodes and a plurality of second electrodes, it is preferable that an equal number of connecting bodies be arranged to each wiring to which a plurality of first or second electrodes are connected in order to flow uniform amounts of current to the respective ones of the plurality of first or second electrodes.

[Arrangement of Plurality of First Connecting Bodies]

When the nitride semiconductor light emitting element has a plurality of first electrodes arranged within one surface of the nitride semiconductor layer uniformly with the centroid of the nitride semiconductor light emitting element as a center, it is preferable that a plurality of first connecting bodies be arranged at positions of equal distance from the centroid of the nitride semiconductor light emitting element in plan view in order to flow uniform amounts of current to the respective ones of the plurality of first electrode. That is, it is preferable that the nitride semiconductor light emitting device of the one aspect has a plurality of first connecting bodies and the plurality of first connecting bodies exist at positions of equal distance from the centroid of the nitride semiconductor light emitting element in plan view.

[Relationship in Area Between Contact Area of First Connecting Bodies to Wiring Layer and First Electrodes]

The first connecting bodies constituting the nitride semiconductor light emitting device of the one aspect electrically connect the wiring layer and the third electrode of the base body to each other.

In the nitride semiconductor light emitting device of the one aspect, from the viewpoint of connection strength and uniformity of current density, it is preferable that a ratio ($S2/S1$) of contact area $S2$ of the first connecting bodies to the wiring layer to area $S1$ in plan view of the first electrodes be 0.25 or more and less than 3.0. The ratio ($S2/S1$) is preferably 0.25 or more and less than 2.0 and more preferably 0.70 or more and less than 1.3.

[Base Body]

The nitride semiconductor light emitting device of the one aspect includes a base body stipulated in the configuration requirement (1). That is, the base body has a surface (facing surface) that faces a surface of the nitride semiconductor light emitting element on which the first electrodes and the second electrodes are formed and has a third electrode and a fourth electrode that are formed on the facing surface. When the nitride semiconductor light emitting element includes a substrate, the base body has a facing surface that faces one surface (surface on which the first electrodes and the second electrodes are formed) of the substrate.

In the nitride semiconductor light emitting device of the one aspect, the third electrode of the base body is electrically connected to the wiring layer via the first connecting bodies.

The base body may have wiring connected to the third and fourth electrodes. By electrically connecting the nitride semiconductor light emitting element to the base body using the first and second connecting bodies and then connecting a power source or a load to the wiring of the base body, it becomes possible to supply the nitride semiconductor light emitting element with current from the outside or to take current out of the nitride semiconductor light emitting element to the outside.

Examples of the base body include a package substrate, a printed substrate, a sub-mount substrate, which can be freely designed later, and a main body portion (a base body to which a semiconductor chip, which is a light-emitting diode, can be connected by first connecting bodies and second connecting bodies) of a lighting device, a water sterilization device, or the like.

Examples of a material of the third electrode and the fourth electrode include metals, such as Al, Cu, Ag, and Au, and an alloy containing such metals. Among the above-described materials, it is preferable to use a material containing Au that has high thermal conductivity, excellent corrosion resistance, and ease of bonding. Each of the third and fourth electrodes may be single-layered or a multi-layered body, or may have a multilayer metal structure in which metal layers are layered with insulating layers interposed therebetween.

[Ultraviolet Light Emitting Device and Ultraviolet Light Emitting Module]

When using an ultraviolet light emitting element that emits light having a wavelength of 360 nm or shorter as the nitride semiconductor light emitting element, the nitride semiconductor light emitting device of the one aspect becomes an ultraviolet light emitting device (hereinafter, referred to as an "ultraviolet light emitting device of one aspect"). Therefore, an ultraviolet light emitting module is included in modules provided with the nitride semiconductor light emitting device of the one aspect.

The ultraviolet light emitting device of the one aspect is applicable to various types of ultraviolet light emitting modules that, using ultraviolet light radiated from the ultraviolet light emitting element, perform sterilization, measurement, resin curing, medical treatment, semiconductor processing, and the like.

Examples of the ultraviolet light emitting module include a sterilization device, a measurement device, a resin curing device, and the like.

Examples of the sterilization device include a device that is constituted by incorporating the ultraviolet light emitting device of the one aspect into a device, such as a refrigerator, an air purifier, a humidifier, a dehumidifier, and a toilet bowl, and, by means of such a sterilization device, sterilization of a place where various bacteria are likely to propagate can be performed.

Other examples of the sterilization device include a device that is constituted by incorporating the ultraviolet light emitting device of the one aspect into a device, such as a water server, a water purifier, a waterer, a wastewater treatment device, and a dialysis water sterilization module, and, by means of such a sterilization device, various bacteria contained in fluid, such as water, can be sterilized.

Other examples of the sterilization device also include a device that is constituted by incorporating the ultraviolet light emitting device of the one aspect into a device, such as a cleaner, a futon drier, a shoe drier, a washing machine, and a laundry drier, and, by means of such a sterilization device, various bacteria contained on the surface and inside of a floor, a cloth, or the like can be sterilized.

Other examples of the sterilization device also include a device that is constituted by incorporating the ultraviolet light emitting device of the one aspect into an indoor germicidal lamp, and, by means of such a sterilization device, sterilization of bacteria in the air can be performed.

[Embodiments of Nitride Semiconductor Light Emitting Element]

Although embodiments of the nitride semiconductor light emitting element of the present invention will be described below, the present invention is not limited to the embodiments to be described below. Although the embodiments to be described below include limitations technically preferable for embodying the present invention, the limitations are not indispensable requirements for the present invention.

Note that, in the drawings to be used in the following description, dimensional relations among respective illustrated portions are sometimes different from actual ones.

[Overall Configuration]

Figure 2:
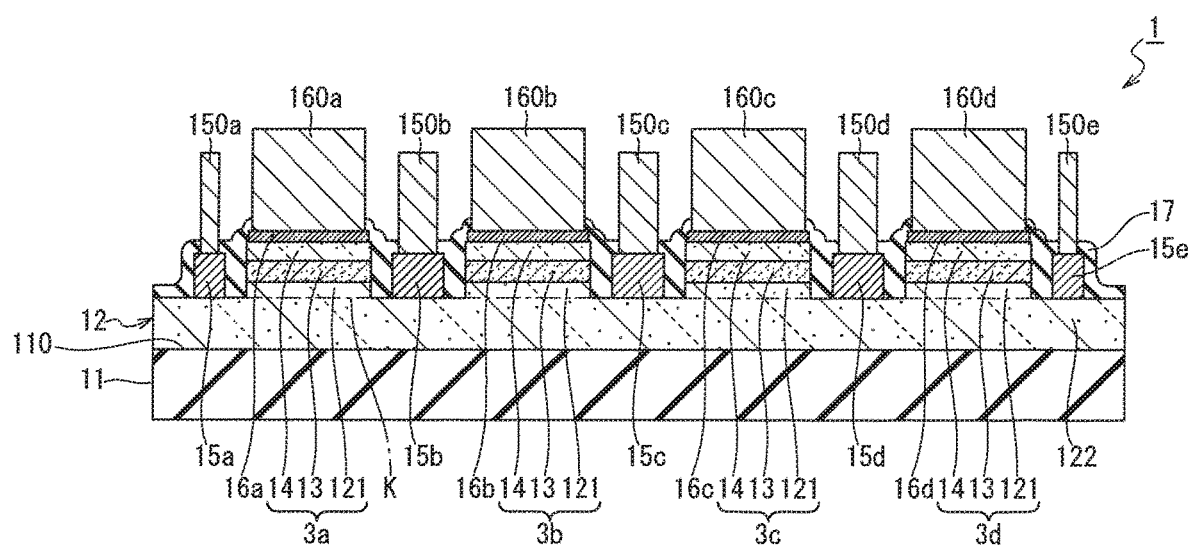
FIG. 2 is a cross-sectional view illustrative of the first example of the nitride semiconductor light emitting element of the present invention and a diagram corresponding to an A-A cross-sectional view of FIG. 1.

As illustrated in FIG. 2, a semiconductor chip 1 that is a nitride semiconductor light emitting element of the embodiments includes a substrate 11, an n-type nitride semiconductor layer (first nitride semiconductor layer of a first conductivity type) 12, nitride semiconductor stacked bodies 3a to 3d, n-type electrodes 15a to 15e, p-type electrodes 16a to 16d, pad electrodes 150a to 150d on the n-type electrodes 15a to 15e, respectively, pad electrodes 160a to 160d on the p-type electrodes 16a to 16d, respectively, and an insulating layer 17.

The n-type nitride semiconductor layer 12 is formed on one surface 110 of the substrate 11. The n-type nitride semiconductor layer 12 includes thick portions 121 and a thin portion 122 that is a portion other than the thick portions 121.

The nitride semiconductor stacked bodies 3a to 3d are four mesa portions formed on the n-type nitride semiconductor layer 12, and each of the nitride semiconductor stacked bodies 3a to 3d is formed by an upper portion of one of the thick portions 121 of the n-type nitride semiconductor layer 12 above a reference plane K, a nitride semiconductor light emitting layer 13, and a p-type nitride semiconductor layer (second nitride semiconductor layer of a second conductivity type) 14. The reference plane K is the upper surface of the thin portion 122 of the n-type nitride semiconductor layer 12.

In each of the nitride semiconductor stacked bodies 3a to 3d, the nitride semiconductor light emitting layer 13 is formed on one of the thick portions 121 of the n-type nitride semiconductor layer 12. The p-type nitride semiconductor layer 14 is formed on the nitride semiconductor light emitting layer 13.

The n-type electrodes 15a to 15e are formed on the thin portion 122 of the n-type nitride semiconductor layer 12. The p-type electrodes 16a to 16d are formed on the respective p-type nitride semiconductor layers 14.

By mesa etching for forming the nitride semiconductor stacked bodies 3a to 3d, a stacked body portion that had existed at a portion in which the n-type electrodes 15a to 15e were to be formed has been removed down to an intermediate level in the thickness direction of the n-type nitride semiconductor layer 12. As a result of the removal, the thin portion 122 is formed to the n-type nitride semiconductor layer 12.

[Material and Others]

The semiconductor chip 1 is an element that emits ultraviolet light having a peak wavelength range of 360 nm or shorter. The substrate 11 is not particularly limited to a specific one as long as being a substrate on one surface 110 of which a nitride semiconductor layer can be formed. Specific examples of a material of which the substrate 11 is formed include sapphire, Si, SiC, MgO, $Ga_2O_3$, $Al_2O_3$, ZnO, GaN, InN, AlN, and a mixed crystal thereof. It is preferable to use a substrate formed of, among the above-described materials, a nitride semiconductor, such as GaN, AlN, and AlGaN, because using such a substrate enables a lattice constant difference between the substrate 11 and respective nitride semiconductor layers formed thereon to be kept small and nitride semiconductor layers to which defects rarely occur to be grown, and it is more preferable to use an AlN substrate. In the above-described material of which the substrate 11 is formed, impurities may be mixed.

A material of which the n-type nitride semiconductor layer 12 is formed is preferably a single crystal or a mixed crystal of AlN, GaN, or InN, and specific examples of the material include $n-Al_xGa_{(1-x)}N$ ($x \geq 0.4$). In such a material, a group V element other than N, such as P, As, and Sb, or impurities, such as C, H, F, O, Mg, and Si, may be contained.

The nitride semiconductor light emitting layer 13 may be single-layered or multilayered and is, for example, a layer having a multiple quantum well (MQW) structure that is constituted by a quantum well layer made of AlGaN and an electron barrier layer made of AlGaN. In the nitride semiconductor light emitting layer 13, a group V element other than N, such as P, As, and Sb, or impurities, such as C, H, F, O, Mg, and Si, may be contained.

Examples of the p-type nitride semiconductor layers 14 include p-GaN layers and p-AlGaN layers, and the p-type nitride semiconductor layers 14 are preferably p-GaN layers. In the p-type nitride semiconductor layers 14, impurities, such as Mg, Cd, Zn, and Be, may be contained.

The insulating layer 17 is formed on a portion of the n-type nitride semiconductor layer 12 that is not covered by the n-type electrodes 15a to 15e, portions of the nitride semiconductor stacked bodies 3a to 3d that are not covered by the p-type electrodes 16a to 16d, respectively, and lower portions of the side surfaces of the pad electrodes 150a to 150d of the n-type electrodes 15a to 15e and the pad electrodes 160a to 160d of the p-type electrodes 16a to 16d. Examples of a material of which the insulating layer 17 is made include oxides and nitrides, such as SiN, $SiO_2$, SiON, $Al_2O_3$, and ZrO layers, but are not limited thereto.

As a material of which the n-type electrodes 15a to 15e are made, for example, Ti, Al, Ni, Au, Cr, V, Zr, Hf, Nb, Ta, Mo, W, or an alloy thereof, or ITO can be used. As a material of which the p-type electrodes 16a to 16d are made, for example, Ni, Au, Pt, Ag, Rh, Pd, Pt, Cu, or an alloy thereof, or ITO can be used. Among these materials, it is preferable to use Ni, Au, or an alloy thereof, or ITO, which has low contact resistance with a nitride semiconductor layer.

Although examples of a material of which the pad electrodes 150a to 150d and 160a to 160d are made include Au, Al, Cu, Ag, and W, it is preferable to use Au, which has high conductivity.

[Planar Shape]

First Example

In FIG. 1, the pad electrode 150a to 150d, the pad electrode 160a to 160d, and the insulating layer 17 are omitted.

As illustrated in FIG. 1, in a first example, the substrate 11 of the semiconductor chip 1 is shaped into a square and the n-type nitride semiconductor layer 12 is formed on the whole of a surface of the substrate 11. That is, the n-type nitride semiconductor layer 12 has a planar shape of a square (rectangle).

As illustrated in FIG. 1, the semiconductor chip 1 has five (a plurality of) n-type electrodes 15a to 15e and four (a plurality of) p-type electrodes 16a to 16d, which are arranged in parallel with one another, in plan view. The n-type electrodes 15a to 15e and the p-type electrodes 16a to 16d are arranged alternately in parallel with one another with gaps interposed therebetween in plan view.

Specifically, in the parallel arrangement, the n-type electrodes 15a and 15b exist on both sides of the p-type electrode 16a and sandwich the p-type electrode 16a. The n-type electrodes 15b and 15c exist on both sides of the p-type electrode 16b and sandwich the p-type electrode 16b. The n-type electrodes 15c and 15d exist on both sides of the p-type electrode 16c and sandwich the p-type electrode 16c. The n-type electrodes 15d and 15e exist on both sides of the p-type electrode 16d and sandwich the p-type electrode 16d.

Gaps K1, K2, K3, K4, K5, K6, K7, and K8 between the n-type electrode 15a and the p-type electrode 16a, the p-type electrode 16a and the n-type electrode 15b, the n-type electrode 15b and the p-type electrode 16b, the p-type electrode 16b and the n-type electrode 15c, the n-type electrode 15c and the p-type electrode 16c, the p-type electrode 16c and the n-type electrode 15d, the n-type electrode 15d and the p-type electrode 16d, and the p-type electrode 16d and the n-type electrode 15e, respectively, have lengths, for example, in a range from 2 μm to 50 μm and preferably in a range from 5 μm to 25 μm.

Setting the gaps K1 to K8 to have lengths of 50 μm or less enables resistance between the p- and n-electrodes to be reduced, and setting the gaps K1 to K8 to have lengths of 2 μm or more enables a risk of occurrence of an inter-electrode short circuit due to misalignment in lithography to be reduced. The gaps K1 to K8 preferably have the same length, and, when there is a difference thereamong, a difference between a maximum length and a minimum length is required to be 5 μm or less and is preferably set at 2 μm or less.

The n-type electrodes 15a to 15e and the p-type electrodes 16a to 16d have belt-like planar shapes and are arranged with the longitudinal directions of the belt shapes in parallel with one another. The longitudinal direction (first direction) of the belt shapes of the n-type electrodes 15a to 15e and the p-type electrodes 16a to 16d and first sides (long sides of a rectangle) 11a extending in the right and left direction in FIG. 1 among the sides of a square shaping the substrate 11 are parallel with each other. That is, the n-type electrodes 15a to 15e and the p-type electrodes 16a to 16d are arranged in parallel with one another with gaps interposed therebetween in a second direction perpendicular to the first direction, which is the extending direction thereof, in plan view.

The first sides 11a and the longitudinal direction of the belt shapes of the n-type electrodes 15a to 15e and the p-type electrodes 16a to 16d may be substantially parallel, instead of strictly parallel, with each other. Being substantially parallel means that displacement (inclination from parallelism) is less than 5°, and it is preferable that the displacement be less than 3°.

The planar shapes of the n-type electrodes 15a to 15e are specifically elongated rectangles, the long sides of which are parallel with the first sides 11a.

Among the n-type electrodes 15a to 15e, the n-type electrodes 15a and 15e, which are arranged at positions closest to edge portions 125 located along the the first sides 11a in the surface of the first nitride semiconductor layer 12, and the n-type electrodes 15b to 15d, which are arranged on the center side (the side away from the edge portions) of the n-type electrodes 15a and 15e in the surface of the first nitride semiconductor layer 12, are n-type electrodes that are not sandwiched by p-type electrodes and n-type electrodes that are sandwiched by p-type electrodes, respectively. Width (a dimension of a short side or a dimension in the second direction) W1 of the rectangle shaping each of the n-type electrodes 15a and 15e, not sandwiched by p-type electrodes, is narrower than width W2 of the rectangle shaping each of the n-type electrodes 15b to 15d, sandwiched by p-type electrodes. That is, W2>W1 holds. It is preferable that the width W1 be 5 µm or more and 50 µm or less. It is preferable that a ratio between the widths (W2/W1) be 1.2 or more and 3.0 or less.

In the following description, the n-type electrodes 15a and 15e, which are not sandwiched by p-type electrodes, and the n-type electrodes 15b to 15d, which are sandwiched by p-type electrodes, are referred to as "n-type electrodes arranged at edge portions", and "n-type electrodes arranged on the inner side", respectively.

The n-type electrodes 15a and 15e have the same planar shape and dimension, and the n-type electrodes 15b to 15d have the same planar shape and dimension. The arrangement of the n-type electrodes 15a to 15e in plan view is line-symmetric with respect to both a straight line L01 that passes through the center C of the square shaping the substrate 11 and is perpendicular to the first sides 11a and a straight line L02 that passes through the center C and is parallel with the first sides 11a.

The planar shapes of the p-type electrodes 16a to 16d are specifically shapes in each of which both ends in the long side direction (longitudinal direction) of a rectangle project in semicircular arc shapes. That is, the p-type electrodes 16a to 16d have, at both ends in the longitudinal direction, projecting portions 161a to 161d that have semicircular arc (curved line) shapes, respectively.

A middle portion in the longitudinal direction of the p-type electrode 16a arranged on the edge side has the same distances from the n-type electrodes 15a and 15b arranged on both sides of the p-type electrode 16a. The semicircular arc-shaped projecting portions 161a forming end portions of the p-type electrode 16a are portions where portions (corner portions of an extended rectangle of a rectangle shaping the middle portion) 162a along the n-type electrodes 15a and 15b, which are arranged on both sides of the p-type electrode 16a, do not exist and the distances of which from the n-type electrodes 15a and 15b gradually increase toward the tips of the p-type electrode 16a.

A middle portion in the longitudinal direction of the p-type electrode 16b arranged on the inner side has the same distances from the n-type electrodes 15b and 15c arranged on both sides of the p-type electrode 16b. The semicircular arc-shaped projecting portions 161b forming end portions of the p-type electrode 16b are portions where portions (corner portions of an extended rectangle of a rectangle shaping the middle portion) 162b along the n-type electrodes 15b and 15c, which are arranged on both sides of the p-type electrode 16b, do not exist and the distances of which from the n-type electrodes 15b and 15c gradually increase toward the tips of the p-type electrode 16b.

A middle portion in the longitudinal direction of the p-type electrode 16c arranged on the inner side has the same distances from the n-type electrodes 15c and 15d arranged on both sides of the p-type electrode 16c. The semicircular arc-shaped projecting portions 161c forming end portions of the p-type electrode 16c are portions where portions (corner portions of an extended rectangle of a rectangle shaping the middle portion) 162c along the n-type electrodes 15c and 15d, which are arranged on both sides of the p-type electrode 16c, do not exist and the distances of which from the n-type electrodes 15c and 15d gradually increase toward the tips of the p-type electrode 16c.

A middle portion in the longitudinal direction of the p-type electrode 16d arranged on the edge side has the same distances from the n-type electrodes 15d and 15e arranged on both sides of the p-type electrode 16d. The semicircular arc-shaped projecting portions 161d forming end portions of the p-type electrode 16d are portions where portions (corner portions of an extended rectangle of a rectangle shaping the middle portion) 162d along the n-type electrodes 15d and 15e, which are arranged on both sides of the p-type electrode 16d, do not exist and the distances of which from the n-type electrodes 15d and 15e gradually increase toward the tips of the p-type electrode 16d.

That is, in the semiconductor chip (nitride semiconductor light emitting element) 1 in the first example, all the p-type electrodes (second electrodes) 16a to 16d have, on both sides in the width direction (second direction) of end portions in the longitudinal direction (first direction), portions the distances of which from first electrodes arranged next thereto gradually increase toward the tips thereof (hereinafter, the portions are referred to as "separating portions" in the sense that the portions separate from, instead of extending along, first electrodes arranged next thereto). Both ends in the longitudinal direction of the p-type electrodes 16a to 16d may be shaped into projecting portions formed by a plurality of straight lines.

The semiconductor chip (nitride semiconductor light emitting element) 1 of the first example includes an electrode pair made up of the p-type electrode 16a and the n-type electrode 15b and an electrode pair made up of the p-type electrode 16d and the n-type electrode 15d as electrode pairs each of which is made up of a first electrode and a second electrode arranged next to each other in the second direction and in each of which a dimension in the first direction of the first electrode is longer than a dimension in the first direction of the second electrode. End portions in the first direction of the p-type electrodes 16a and 16d in the electrode pairs have separating portions on the sides thereof where the n-type electrodes (first electrodes) 15b and 15d in the electrode pairs are located, respectively.

The short sides of the rectangle shaping each of the p-type electrodes 16a and 16d are longer than the short sides (width W2) of the rectangle shaping each of the n-type electrodes 15a to 15e.

The p-type electrodes 16a and 16d, which are arranged next to the n-type electrodes 15a and 15e arranged at the edge portions, have the same planar shape and dimension, and the p-type electrodes 16b and 16c, which are arranged on the center side (the side away from the edge portions) of the p-type electrodes 16a and 16d, respectively, have the same planar shape and dimension. The arrangement of the p-type electrodes 16a to 16d in plan view is line-symmetric with respect to both the straight lines L01 and L02. That is, the arrangement of all of the n-type electrodes 15a to 15e and the p-type electrodes 16a to 16d in plan view is line-symmetric with respect to both the straight lines L01 and L02.

In the surface of the n-type nitride semiconductor layer 12 of the semiconductor chip 1, there exists neither an n-type electrode other than the n-type electrodes 15a to 15e nor a p-type electrode other than the p-type electrodes 16a to 16d. That is, on the outside in the longitudinal direction (the direction perpendicular to the direction of the parallel arrangement) of the belt shapes shaping the n-type electrodes 15a to 15e, no p-type electrode (second electrode) excluded from the parallel arrangement exists. On the outside in the longitudinal direction (the direction perpendicular to the direction of the parallel arrangement) of the belt shapes shaping the p-type electrodes 16a to 16d, no n-type electrode (first electrode) excluded from the parallel arrangement exists.

A dimension L1 of the first sides 11a and length L2 of the long sides (dimension in the longitudinal direction) of the n-type electrode 15a and 15e arranged at the edge portions satisfy the formula (1) below. The dimension L1 of the first sides 11a and length L3 of the long sides (dimension in the longitudinal direction) of the p-type electrode 16a and 16d arranged on the edge sides satisfy the formula (2) below. It is preferable that a relationship between L1 and L2 satisfy the formula (11) below. It is preferable that a relationship between L1 and L3 satisfy the formula (21) below.

$$140 \ \mu m < L1 - L2 < 650 \ \mu m \qquad (1)$$

$$140 \ \mu m < L1 - L3 < 650 \ \mu m \qquad (2)$$

$$200 \ \mu m < L1 - L2 < 500 \ \mu m \qquad (11)$$

$$200 \ \mu m < L1 - L3 < 500 \ \mu m \qquad (21)$$

Satisfaction of the formulae described above by the relationship between the dimensions L1 and L2 and the relationship between the dimensions L1 and L3, for example, provides the following advantageous effect. A nitride semiconductor light emitting device to be described later is achieved by connecting the semiconductor chip (nitride semiconductor light emitting element) 1 to a package substrate (base body) 2 by use of first connecting bodies formed on the n-type electrodes (first electrodes) 15a to 15e with the wiring layer 18 interposed therebetween and second connecting bodies formed on the p-type electrodes 16a to 16d. In that case, satisfaction of the formulae described above by the relationship between the dimensions L1 and L2 and the relationship between the dimensions L1 and L3 enables spaces in each of which a gold ball having a diameter of several tens of μm, which is generally used as a first connecting body, can be arranged to be secured (see FIG. 16, to be described later).

An absolute value (|L4−L2|) of a difference between the length L2 of the long sides (dimension in the longitudinal direction) of the n-type electrodes 15a and 15e, arranged at the edge portions, and length L4 of the long sides (dimension in the longitudinal direction) of the n-type electrodes 15b to 15d, arranged on the inner side, is greater than 0 and less than 500 μm. It is preferable that the absolute value |L4−L2| be 400 μm or greater and less than 500 μm.

An absolute value of a difference between the length L3 of the long sides (dimension in the longitudinal direction) of the p-type electrodes 16a and 16d, arranged on the edge sides, and a dimension L5 in the longitudinal direction of the p-type electrodes 16b and 16c, arranged on the inner side, is greater than 0 and less than 500 μm. It is preferable that the absolute value |L5−L3| be 100 μm or greater and 300 μm or less.

All the projecting portions 161a to 161d, having semicircular arc (curved line) shapes, of the p-type electrodes 16a to 16d have the same shape. That is, the p-type electrodes 16a and 16d, arranged on the edge sides, and the p-type electrodes 16b and 16c, arranged on the inner side, have the same radius R of curvature for "curved lines forming projecting portions" at both ends in the longitudinal direction. The radius R of curvature is preferably greater than 0 and less than 200 μm, more preferably satisfies 20<R<150 μm, and further more preferably satisfies 80<R<120 μm.

It is preferable that the total number of the first electrodes and the second electrodes (in the example, the n-type electrodes 15a to 15e and the p-type electrodes 16a to 16d) arranged in parallel with one another be a number "t" to be described below, "t+1", or "t−1". The number "t" is obtained by, based on T that is obtained by using a dimension S1 of the first nitride semiconductor layer in the direction in which the first electrodes and the second electrodes are arranged (in the example, S1 is a dimension of the sides perpendicular to the first sides 11a and is equal to L1), width S2 of the first electrodes (in the example, S2 is an average value of W1 and W2), and width S3 of the second electrodes and by means of the formula (3) below, setting T to t when T is an integer and setting an integer obtained by rounding off T to t when T is not an integer.

$$T = S1/(S2 + S3) \qquad (3)$$

Although, in the semiconductor chip 1 of the embodiment, the width W1 is the same between the two n-type electrodes 15a and 15e, which are first electrodes not sandwiched by second electrodes, the widths of the electrodes may be different from each other. Although the width W2 is the same among the three n-type electrodes 15b to 15d, which are first electrodes (inner side first electrodes) sandwiched by second electrodes, the width of some of the inner side first electrodes may be different from that (those) of the other (s) among the plurality of inner side first electrodes or widths may be different from one another among all the inner side first electrodes.

Although the semiconductor chip 1 of the embodiment has the n-type electrodes and the p-type electrodes as first electrodes and second electrodes, respectively, the nitride semiconductor light emitting element of the one aspect can be applied to a case in which p-type electrodes and n-type electrodes are first electrodes and second electrodes, respectively.

[Actions and Advantageous Effects]

The semiconductor chip (nitride semiconductor light emitting element) 1 of the embodiment, through the n-type electrodes 15a to 15e and the p-type electrodes 16a to 16d having the above-described planar shapes and arrangement in plan view, enables current concentration to be suppressed as compared with a conventional nitride semiconductor light emitting element (a nitride semiconductor light emitting element having different planar shapes and arrangement in plan view of n-type electrodes and p-type electrodes from those of the semiconductor chip 1, for example, a nitride semiconductor light emitting element described in PTL 1). As a result, the semiconductor chip 1 can provide high output at a low voltage. That is, external quantum efficiency can be increased.

A nitride semiconductor used for nitride semiconductor light emitting elements, in general, has a high resistance and causes a noticeable bias in current density distribution as compared with Si or the like used for LSIs. Therefore, in a nitride semiconductor light emitting element, effect obtainable by increasing the degree of freedom in designing an arrangement of electrodes is substantially large.

A nitride semiconductor light emitting element described as an embodiment in PTL 1 has a p-type electrode and an n-type electrode, and the p-type electrode has a shape in which central portions in the longitudinal direction of a plurality of belt-shaped portions that are arranged in parallel with one another with spaces interposed therebetween in plan view are connected with one another by a connecting portion. Each of the plurality of belt-shaped portions has a shape in which both ends in the long side direction (longitudinal direction) of a rectangle project in a semicircular arc shape. That is, the p-type electrode has, at both ends in the longitudinal direction of the belt-shaped portions, semicircular arc-shaped projecting portions.

On the outside of the p-type electrode, the n-type electrode that has an outer shape line extending along the outer shape line of the p-type electrode exists. That is, portions of the n-type electrode exist on the outside of the p-type electrode in the direction perpendicular to the direction of the parallel arrangement of the plurality of belt-shaped portions constituting the p-type electrode. Because of this arrangement, current concentrates on the semicircular arc-shaped projecting portions of the p-type electrode in the nitride semiconductor light emitting element (an embodiment in PTL 1). In addition, in interspaces (which exist only on both sides of the connection portions) between the plurality of belt-shaped portions of the p-type electrode, belt-shaped portions of the n-type electrode exist. That is, portions of the p-type electrode exist on the outside of the n-type electrode in the direction perpendicular to the direction of the parallel arrangement of the plurality of belt-shaped portions constituting the n-type electrode.

On the other hand, since, in the semiconductor chip 1 of the first example (an embodiment of the present invention), no n-type electrode exists on the outside of the p-type electrodes 16a to 16d in the direction perpendicular to the direction of the parallel arrangement of the p-type electrodes 16a to 16d, which are arranged in parallel with one another, current is suppressed from concentrating on end portions of the p-type electrodes 16a to 16d in the direction perpendicular to the direction of the parallel arrangement thereof. Although, when corner portions exist at both ends in the longitudinal direction of the p-type electrodes 16a to 16d, current concentrates on the corner portions, the current concentration is further suppressed because both ends in the longitudinal direction of the p-type electrodes 16a to 16d are shaped into the semicircular arc-shaped projecting portions 161a to 161d (that is, having separating portions).

In addition, setting the width W2 of the n-type electrode 15b to 15d, which are arranged on the inner side, at twice the width W1 of the n-type electrode 15a and 15e, which are arranged at the edge portions, enables current respectively flowing from the n-type electrodes 15a and 15b to the p-type electrode 16a, from the n-type electrodes 15b and 15c to the p-type electrode 16b, from the n-type electrodes 15c and 15d to the p-type electrode 16c, and from the n-type electrodes 15d and 15e to the p-type electrode 16d to be the same. For this reason, setting the widths W1 and W2 so as to satisfy W1<W2 enables current concentration to be more suppressed than in a case where the widths W1 and W2 are set so as to satisfy W1≥W2.

In addition, in the semiconductor chip 1 of the first example, among resistance values between the n-type electrodes 15a and 15e (first electrodes not sandwiched by second electrodes), arranged at the edge portions, and the p-type electrodes 16a and 16d, arranged next to the n-type electrodes 15a and 15e, a resistance value R1 at the projecting portions 161a and 161d (both end portions in the first direction) and a resistance value R2 at portions other than the projecting portions 161a and 161d (middle portions) are practically the same. Because of this relationship between the resistance values R1 and R2, in the semiconductor chip 1 of the first example, current flowing in the projecting portions 161a and 161d and current flowing in the portions other than the projecting portions 161a and 161d, when voltage is applied between both electrodes, become practically the same, which enables local concentration of current within the element to be suppressed. In consequence, element breakdown caused by local concentration of current can be prevented.

The resistance value R1 is an average value of respective resistance values between the projecting portions 161a and 161d (both end portions in the first direction) and the n-type electrodes 15a and 15e (first electrodes not sandwiched by second electrodes), located next to the projecting portions 161a and 161d, respectively.

Further, the semiconductor chip 1 of the first example can be manufactured at a lower cost than a nitride semiconductor light emitting element described in PTL 2.

Second Example

Figure 3:
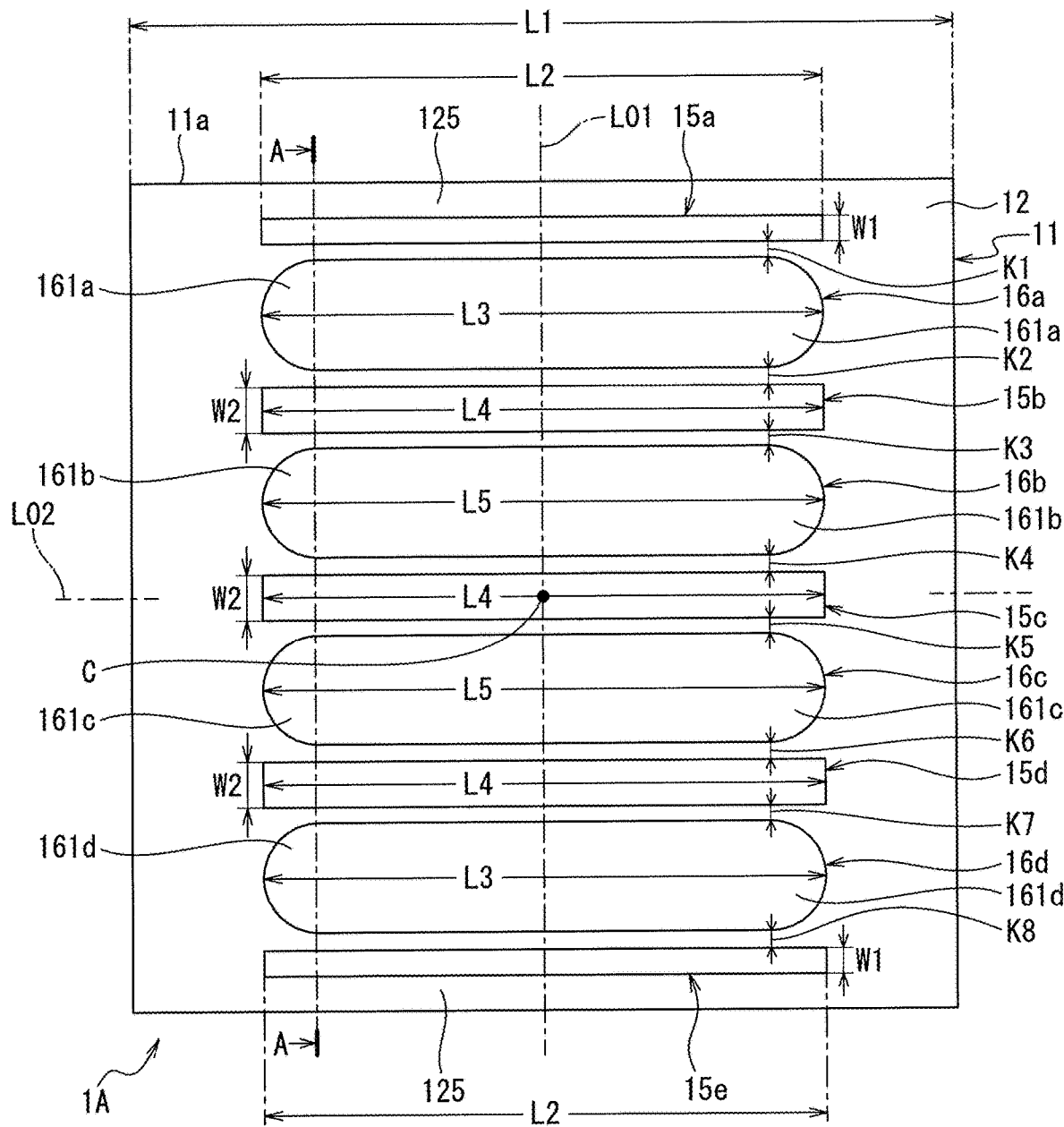
FIG. 3 is a plan view descriptive of a second example of the nitride semiconductor light emitting element of the present invention.

A semiconductor chip 1A of a second example, differing from the semiconductor chip 1 of the first example, has a planar shape illustrated in FIG. 3. The semiconductor chip 1A has the same features as the semiconductor chip 1 of the first example except this feature.

As illustrated in FIG. 3, lengths L2 and L4 of the long sides of n-type electrodes 15a to 15e constituting the semiconductor chip 1A of the second example are the same, and all lengths L3 to L5 of the long sides of p-type electrodes 16a to 16d constituting the semiconductor chip 1A are the same.

Third Example

Figure 4:
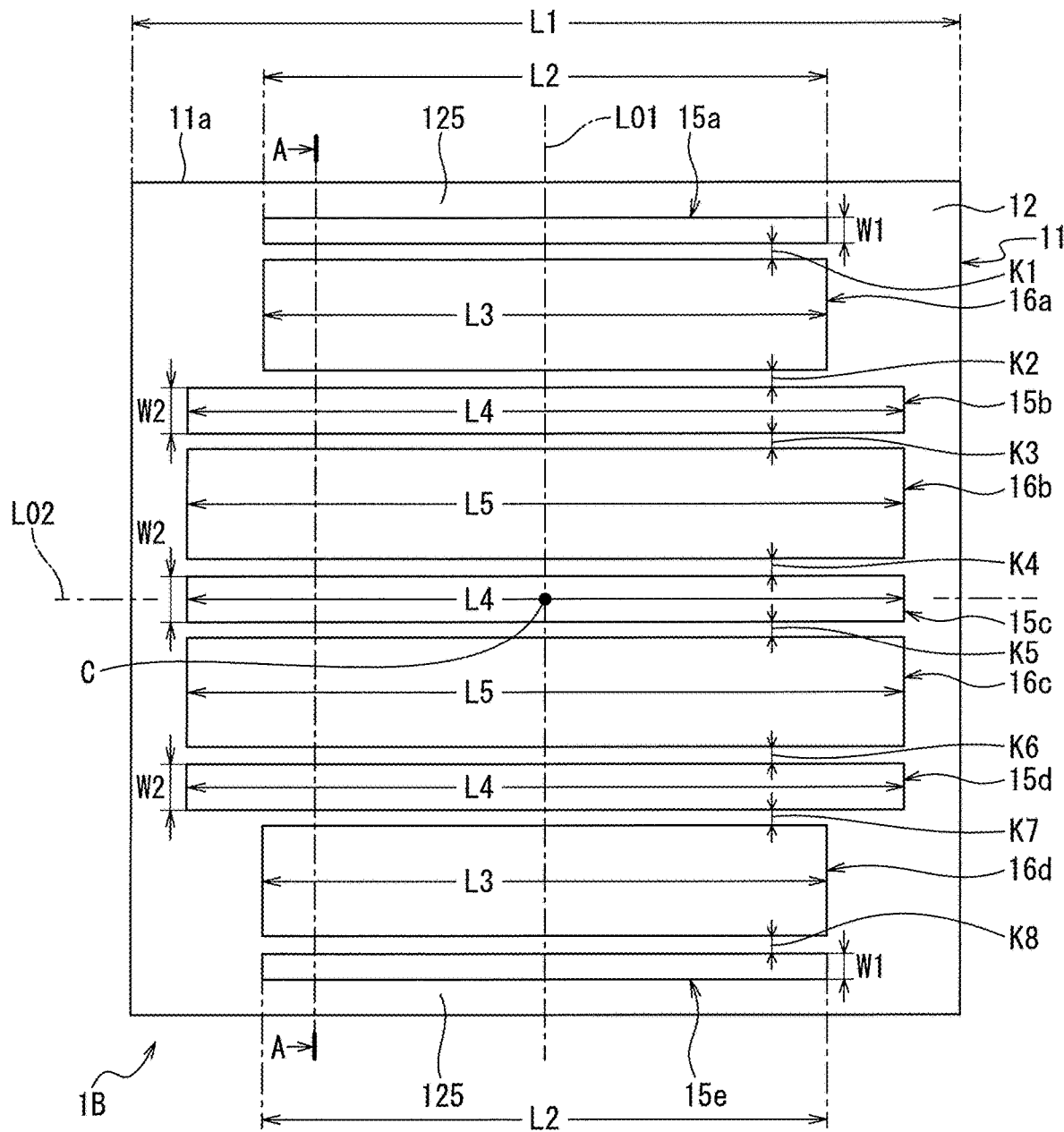
FIG. 4 is a plan view descriptive of a third example of the nitride semiconductor light emitting element of the present invention.

A semiconductor chip 1B of a third example, differing from the semiconductor chip 1 of the first example, has a planar shape illustrated in FIG. 4. The semiconductor chip 1B has the same features as the semiconductor chip 1 of the first example except this feature.

As illustrated in FIG. 4, p-type electrodes 16a to 16d constituting the semiconductor chip 1B of the third example have rectangular planar shapes and do not have separating portions at both ends in the longitudinal direction.

Fourth Example

Figure 5:
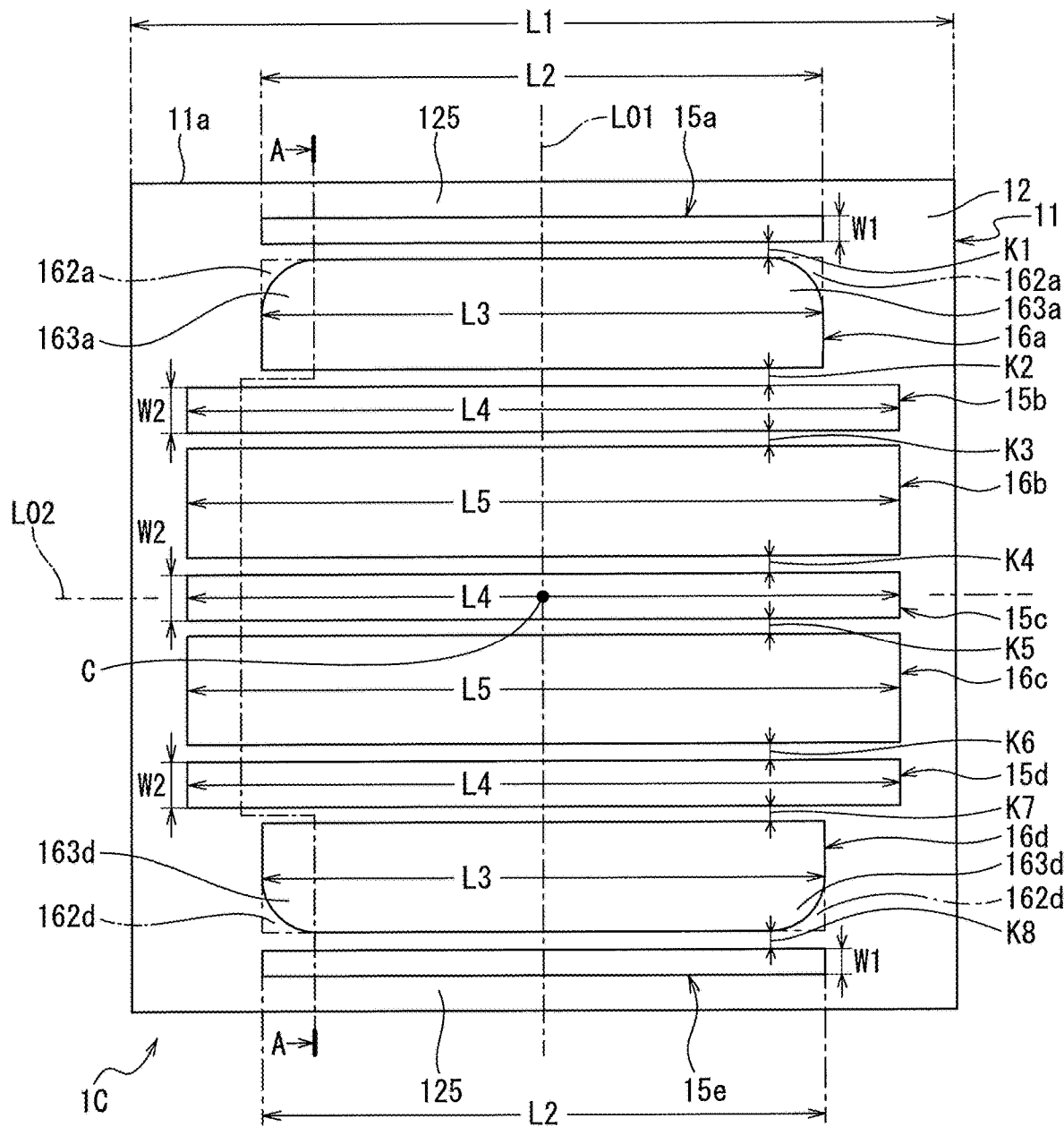
FIG. 5 is a plan view descriptive of a fourth example of the nitride semiconductor light emitting element of the present invention.

A semiconductor chip 1C of a fourth example, differing from the semiconductor chip 1 of the first example, has a planar shape illustrated in FIG. 5. The semiconductor chip 1C has the same features as the semiconductor chip 1 of the first example except this feature.

As illustrated in FIG. 5, p-type electrodes 16a and 16d arranged on the edge sides and constituting the semiconductor chip 1C of the fourth example have different planar shapes from p-type electrodes 16b and 16c arranged on the inner side and constituting the semiconductor chip 1C.

The planar shapes of the p-type electrodes 16a and 16d arranged on the edge sides are shapes in which, at both ends in the long side direction (longitudinal direction) of rectangles, only corner portions on the sides where n-type electrode 15a and 15e, which are arranged at edge portions, are located are rounded into circular arc shapes, respectively. That is, middle portions in the longitudinal direction of the p-type electrodes 16a and 16d arranged on the edge sides have the same distances from the n-type electrodes 15a and 15e arranged next to the p-type electrodes 16a and 16d, respectively. At end portions of the p-type electrodes 16a and 16d, portions (corner portions of extended rectangles of rectangles shaping the middle portions) 162a and 162d along the n-type electrodes 15a and 15e, which are arranged next to the p-type electrodes 16a and 16d, respectively, do not exist, and distances of the end portions from the n-type electrodes 15a and 15e gradually increase toward the tips of the p-type electrodes 16a and 16d, respectively.

That is, in the semiconductor chip 1C of the fourth example, the p-type electrodes 16a and 16d arranged on the edge sides have portions (separating portions) the distances of which from the n-type electrodes arranged next thereto gradually increase toward the tips thereof on one side in the width direction (second direction) of end portions in the longitudinal direction (first direction) thereof, respectively.

P-type electrodes 16b and 16c arranged on the inner side respectively have rectangular planar shapes and do not have separating portions at both ends in the longitudinal direction.

The semiconductor chip 1C of the fourth example has an electrode pair made up of the p-type electrode 16a and the n-type electrode 15b and an electrode pair made up of the p-type electrode 16d and the n-type electrode 15d as electrode pairs each of which is made up of a first electrode and a second electrode arranged next to each other in the second direction and in each of which a dimension in the first direction of the first electrode is longer than a dimension in the first direction of the second electrode. End portions in the first direction of the p-type electrodes 16a and 16d in the electrode pairs do not have separating portions on the sides thereof where the n-type electrodes (first electrodes) 15b and 15d in the electrode pairs are located, respectively.

Fifth Example

Figure 6:
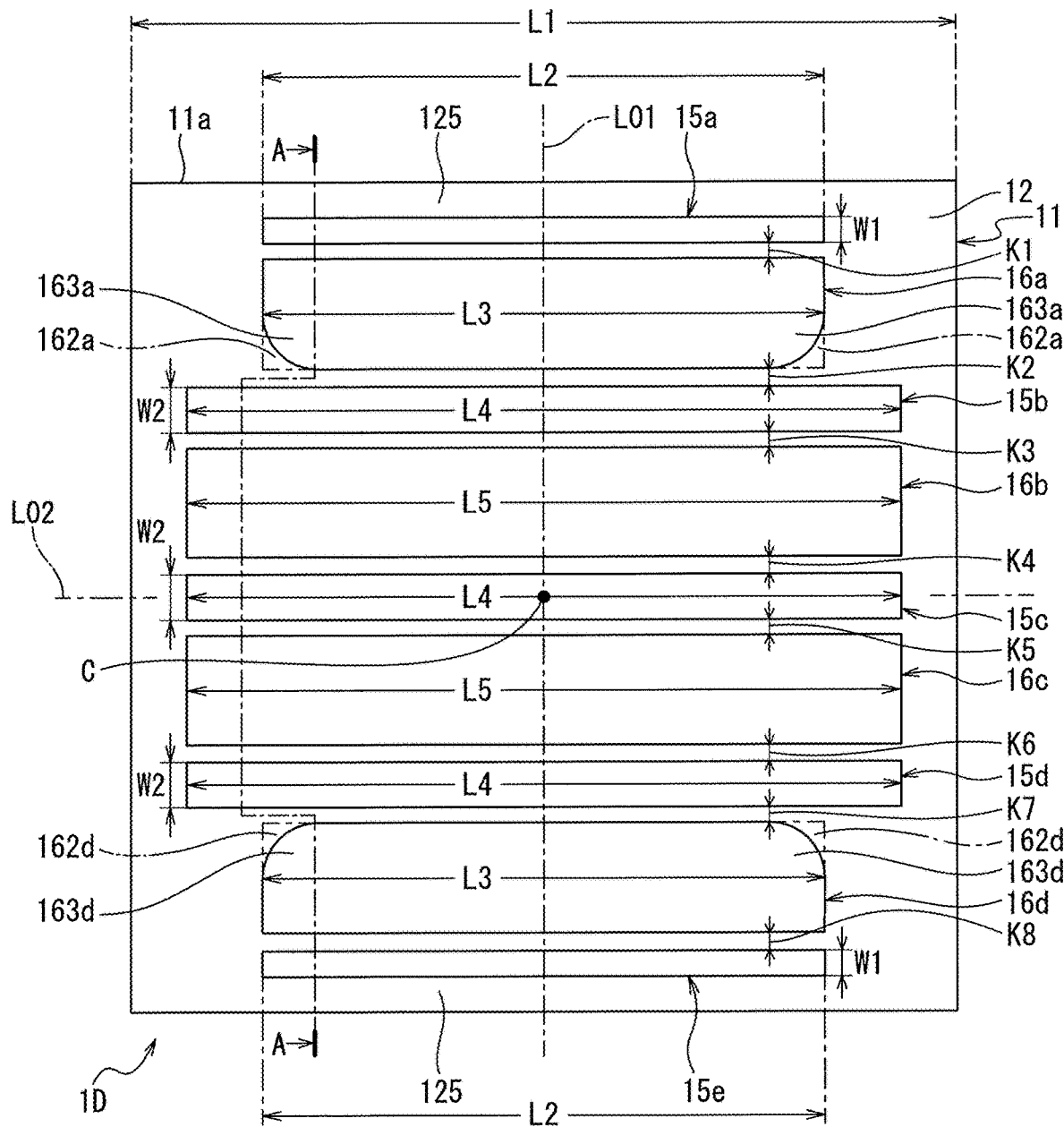
FIG. 6 is a plan view descriptive of a fifth example of the nitride semiconductor light emitting element of the present invention.

A semiconductor chip 1D of a fifth example, differing from the semiconductor chip 1 of the first example, has a planar shape illustrated in FIG. 6. The semiconductor chip 1D has the same features as the semiconductor chip 1 of the first example except this feature.

As illustrated in FIG. 6, p-type electrodes 16a and 16d arranged on the edge sides and constituting the semiconductor chip 1D of the fifth example have different planar shapes from p-type electrodes 16b and 16c arranged on the inner side.

The planar shapes of the p-type electrodes 16a and 16d arranged on the edge sides are shapes in which, at both ends in the long side direction (longitudinal direction) of rectangles, only corner portions on the sides where n-type electrode 15b and 15d, which are arranged on the inner side, are located are rounded into circular arc shapes, respectively. That is, middle portions in the longitudinal direction of the p-type electrodes 16a and 16d arranged on the edge sides have the same distances from the n-type electrodes 15b and 15d arranged next to the p-type electrodes 16a and 16d, respectively. At end portions of the p-type electrodes 16a and 16d, portions (corner portions of extended rectangles of rectangles shaping the middle portions) 162a and 162d along the n-type electrodes 15b and 15d, which are arranged next to the p-type electrodes 16a and 16d, respectively, do not exist, and distances of the end portions from the n-type electrodes 15b and 15d gradually increase toward the tips of the p-type electrodes 16a and 16d, respectively.

That is, in the semiconductor chip 1D of the fifth example, the p-type electrodes 16a and 16d arranged on the edge sides have portions (separating portions) the distances of which from the n-type electrodes arranged next thereto gradually increase toward the tips thereof on one side in the width direction (second direction) of end portions in the longitudinal direction (first direction) thereof, respectively.

P-type electrodes 16b and 16c arranged on the inner side respectively have rectangular planar shapes and do not have separating portions at both ends in the longitudinal direction.

The semiconductor chip 1D of the fifth example has an electrode pair made up of the p-type electrode 16a and the n-type electrode 15b and an electrode pair made up of the p-type electrode 16d and the n-type electrode 15d as electrode pairs each of which is made up of a first electrode and a second electrode arranged next to each other in the second direction and in each of which a dimension in the first direction of the first electrode is longer than a dimension in the first direction of the second electrode. End portions in the first direction of the p-type electrodes 16a and 16d in the electrode pairs have separating portions 163a and 163d on the sides thereof where the n-type electrodes (first electrodes) 15b and 15d in the electrode pairs are located, respectively.

[Performance Comparison]

<Simulation 1>

Figure 7:
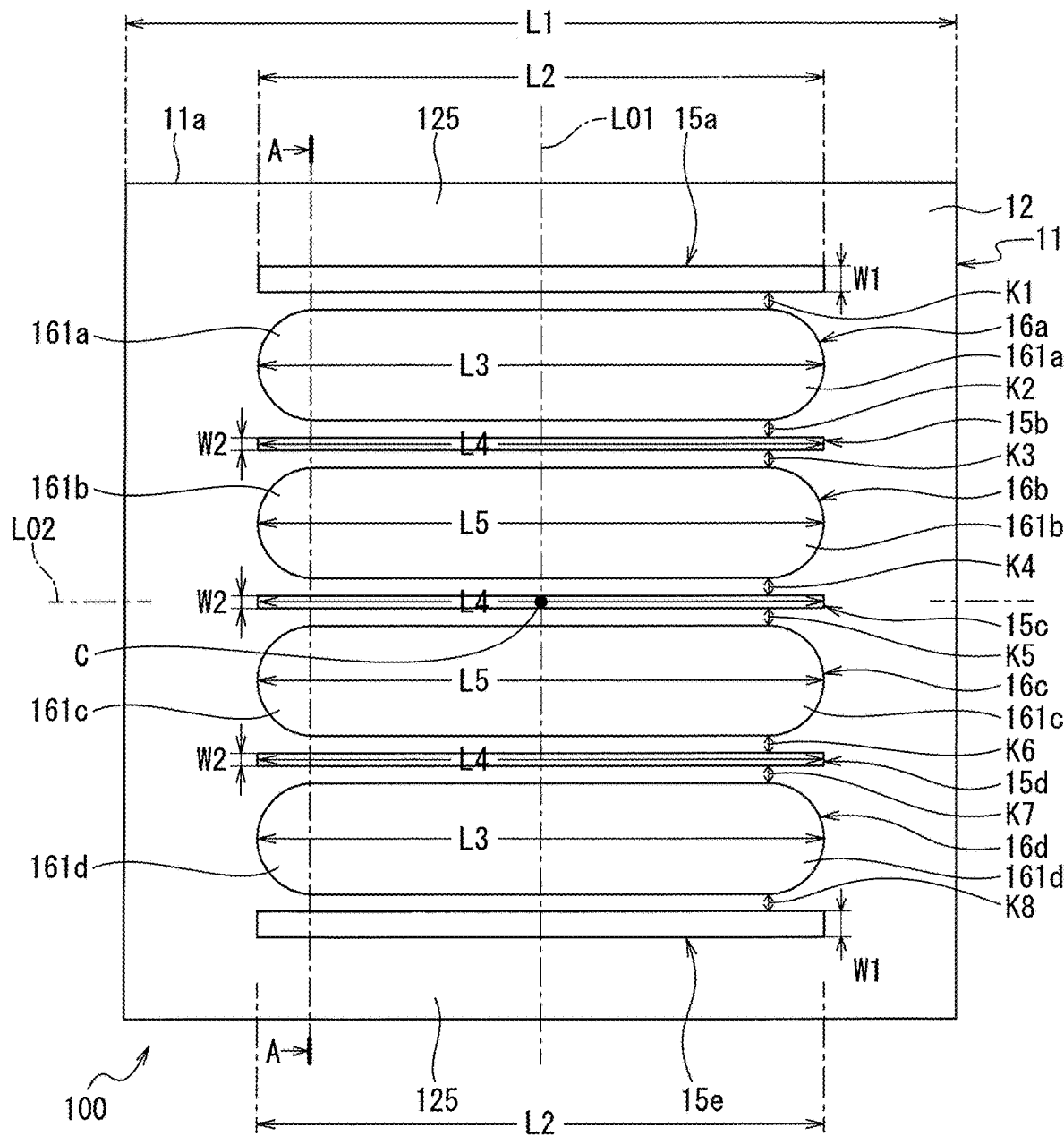
FIG. 7 is a plan view descriptive of a semiconductor chip (nitride semiconductor light emitting element) of a comparative example 1.

A simulation for assessing differences between the semiconductor chip 1A of the second example illustrated in FIG. 3 and a semiconductor chip 100 of a comparative example 1 illustrated in FIG. 7 was conducted.

In the semiconductor chip 100 of the comparative example 1, width W1 of rectangles shaping n-type electrodes 15a and 15e arranged at edge portion is wider than width W2 of rectangles shaping n-type electrodes 15b to 15d arranged on the inner side. That is, W1>W2 holds.

In the semiconductor chip 100 of the comparative example 1, the n-type electrodes 15a to 15e and p-type electrodes 16a to 16d are formed in a pattern symmetric about a point C, which is the same as that of the semiconductor chip 1A of the second example. In the semiconductor chip 100 of the comparative example 1, gaps K1 to K8 are the same as those in the semiconductor chip 1A of the second example.

Distributions of current density (the amount of current flowing per unit area in the direction perpendicular to the substrate 11) in the nitride semiconductor light emitting layers 13 right below the p-type electrodes 16a to 16d were simulated with respect to a semiconductor chip that is the semiconductor chip 100 of the comparative example 1 and has a width W1 of 25 µm and a width W2 of 15 µm and semiconductor chips that are the semiconductor chip 1A of the second example and have a width W1 of 25 µm and widths W2 of 25 µm, 35 µm, 45 µm, 50 µm, 55 µm, and 65 µm. As a result of the simulation, a graph illustrated in FIG. 8A was obtained. In the graph in FIG. 8A, the ordinate and the abscissa represent a maximum value of current density within the surfaces of the nitride semiconductor light emitting layers 13 and W1-W2, respectively.

Simulation conditions are the same for all cases except the width W2. The simulation conditions will be described below.

In this simulation, simulation software manufactured by STR, "SiLENSe", and simulation software manufactured by STR, "SpeCLED", were used.

<Substrate 11>
Material: AlN
Plane dimension: 775 µm×807 µm
Thickness: 100 µm

<n-type semiconductor layer 12>
Thickness: 0.5 µm
Thermal conductivity: 130 W/m/K
Mobility: 50 cm$^2$/Vs
Impurity density: 1 e$^{19}$ cm$^{-3}$ <p-type semiconductor layer 14>
  Thickness: 0.06 μm
  Thermal conductivity: 120 W/m/K
  Mobility: 5 cm²/Vs
  Impurity density: 2 $e^{19=-3}$
<Mesa portions 3a to 3d>
  Height: 0.211 μm
<p-type electrodes 16a to 16d>
  Thickness: 0.055 μm
<n-type electrodes 15a to 15e>
  Thickness: 0.25 μm
<n-type pad electrodes 150a to 150e>
  Thickness: 1 μm, Thermal conductivity: 318 W/m/K,
  Electric Conductivity: 4.5 $e^5$ S/cm
<p-type pad electrodes 160a to 160e>
  Thickness: 1 μm, Thermal conductivity: 318 W/m/K,
  Electric Conductivity: 4.5 $e^5$ S/cm
<Others>
  n-type contact resistance: 3 $e^{-3}$ Ω·cm²
  p-type contact resistance: 1 $e^{-3}$ Ω·cm²
  Current value: 500 mA
  Initial temperature: 300 K The nitride semiconductor light emitting layer 32 was calculated for an MQW spectrum at a wavelength of 265 nm and correlation data of the current density and the voltage at 100 K intervals in a temperature range of from 300 K to 500 K using the "SiLENSe".

Figure 8A:
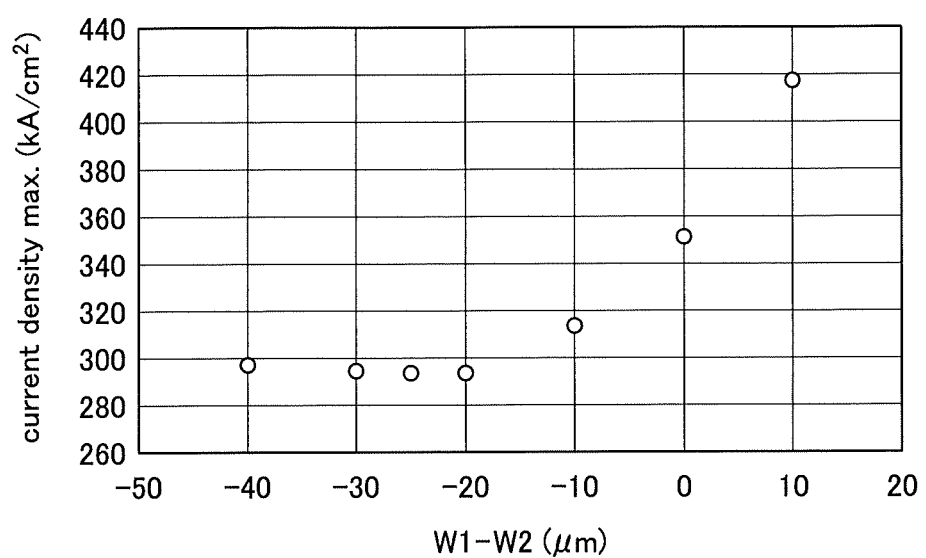
FIG. 8A is a graph illustrative of a relationship between a maximum value of current density and a dimensional difference among first electrodes with respect to nitride semiconductor light emitting elements obtained in a simulation 1.
Figure 8B:
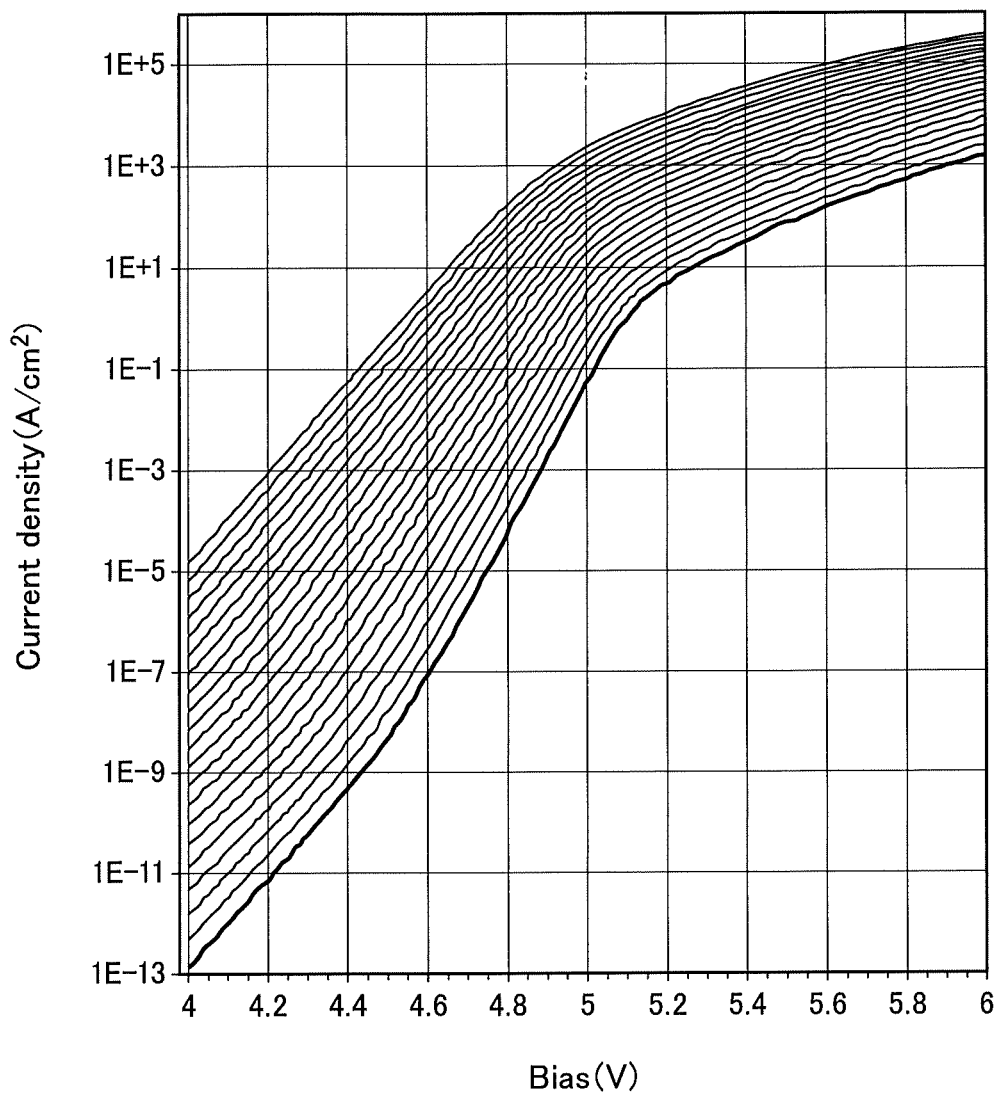
FIG. 8B is a graph illustrative of a relationship between current density and a potential difference with respect to the nitride semiconductor light emitting elements obtained in the simulation 1.
Figure 8C:
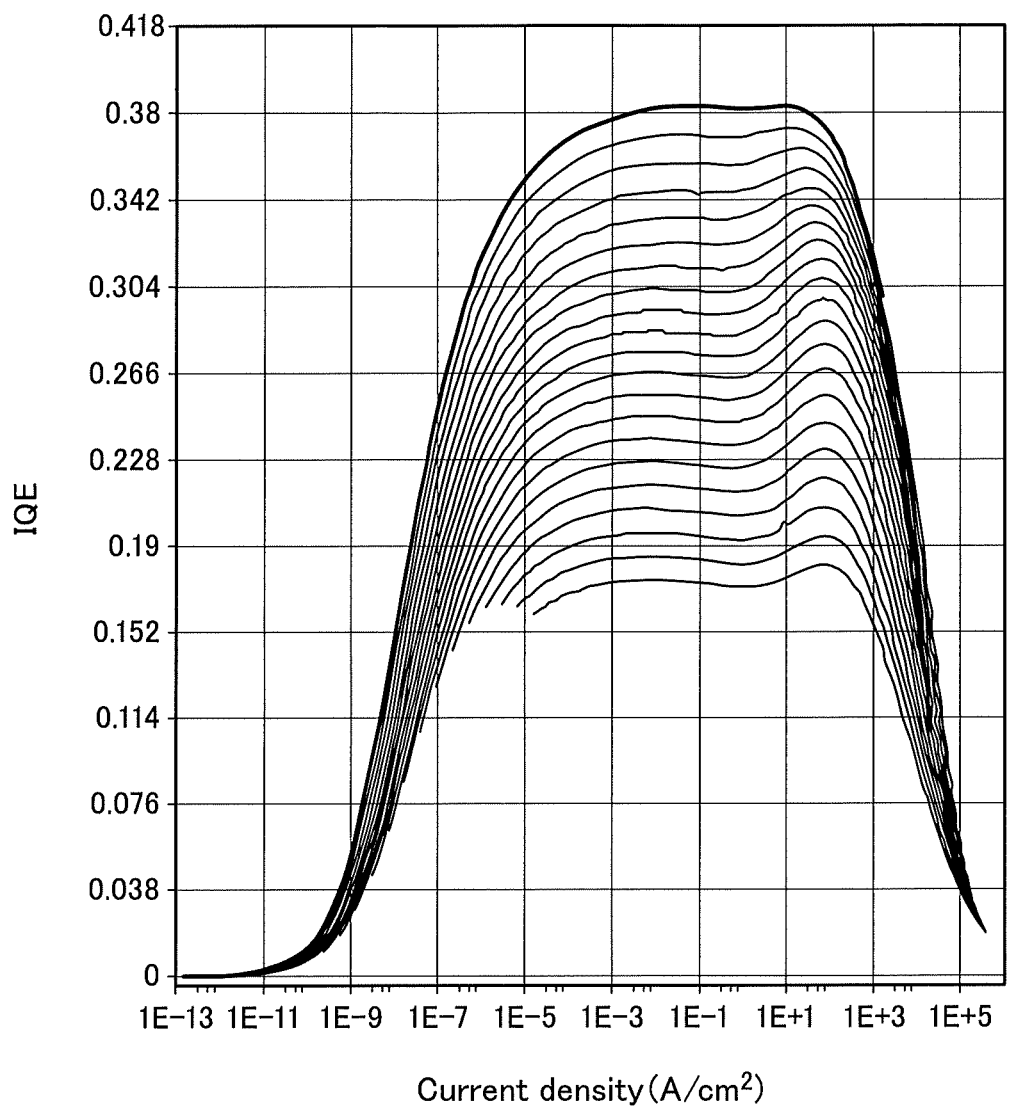
FIG. 8C is a graph illustrative of a relationship between internal quantum efficiency (IQE) and current density with respect the nitride semiconductor light emitting elements obtained in the simulation 1.

Graphs indicating a result of the SiLENSe and therewith illustrating a hypothesis in the SpeCLED are illustrated in FIGS. 8B and 8C.

The abscissa and the ordinate of the graph in FIG. 8B represent a potential difference (voltage) and current density, respectively. The curves in FIG. 8B indicate, in order from the bottom, cases where temperature are 300 K, 310 K, . . . , 490 K, and 500 K at 10 K intervals. The abscissa and the ordinate of the graph in FIG. 8C represent current density and internal quantum efficiency (IQE), respectively. The curves in FIG. 8C indicate, in order from the top, cases where temperature are 300 K, 310 K, . . . , 490 K, and 500 K at 10 K intervals.

The graph in FIG. 8A reveals that setting the widths W1 and W2 so as to satisfy W1−W2<0, that is, W2>W1, enables the maximum value of current density to be substantially reduced, that is, current concentration to be suppressed, as compared with the case where the widths W1 and W2 are set so as to satisfy W2 W1. In the semiconductor chip 100 of the comparative example 1, the current density was notably high at portions on the sides of the p-type electrodes 16a and 16d, arranged on the edge sides, where the n-type electrodes 15a and 15e, arranged at the edge portions, are located, respectively.

<Simulation 2>

Figure 9:
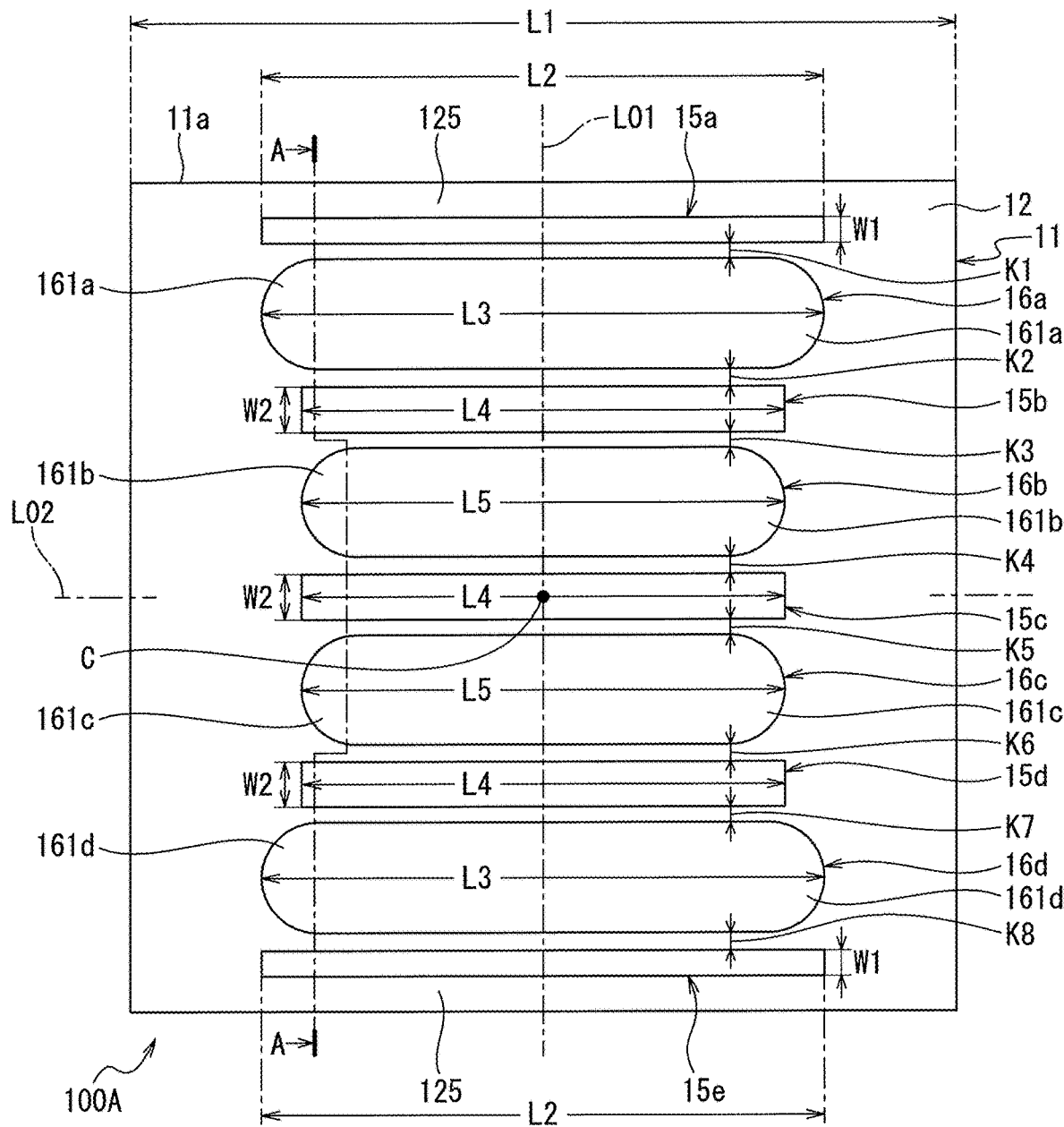
FIG. 9 is a plan view descriptive of a semiconductor chip (nitride semiconductor light emitting element) of a comparative example 2.

A simulation for assessing differences among the semiconductor chip 1 of the first example illustrated in FIG. 1, the semiconductor chip 1A of the second example illustrated in FIG. 3, and a semiconductor chip 100A of a comparative example 2 illustrated in FIG. 9 was conducted.

The semiconductor chip 100A of the comparative example 2 has the same features as the semiconductor chip 1 of the first example and the semiconductor chip 1A of the second example except that lengths L4 and L5 in the first direction of n-type electrodes 15b to 15d and p-type electrodes 16b and 16d, which are arranged on the inner side, respectively, are different from those of the semiconductor chips 1 and 1A.

While L2<L4 and L3<L5 hold for the semiconductor chip 1 of the first example and L2=L4 and L3=L5 hold for the semiconductor chip 1A of the second example, L2>L4 and L3>L5 hold for the semiconductor chip 100A of the comparative example 2.

Distributions of current density (the amount of current flowing per unit area in the direction perpendicular to the substrate 11) in the nitride semiconductor light emitting layers 13 right below the p-type electrodes 16a to 16d were simulated with respect to semiconductor chips corresponding to the semiconductor chip 1 of the first example, the semiconductor chip 1A of the second example, and the semiconductor chip 100A of the comparative example 2 with L2, L3, W1, and W2 fixed to 553 μm, 553 μm, 25 μm, and 50 μm, respectively.

The length L4 of a semiconductor chip corresponding to the semiconductor chip 1A of the second example is 553 μm. The lengths L4 and L5 of a semiconductor chip corresponding to the semiconductor chip 100A of the comparative example 2 are 473 μm and 473 μm, respectively, and the lengths L4 and L5 of another semiconductor chip corresponding to the semiconductor chip 100A are 513 μm and 513 μm, respectively. The lengths L4 and L5 of a semiconductor chip corresponding to the semiconductor chip 1 of the first example are 594 μm and 594 μm, respectively, and the lengths L4 and L5 of another semiconductor chip corresponding to the semiconductor chip 1 are 633 μm and 633 μm, respectively.

Simulation conditions are the same for all cases except the above-described conditions. The simulation conditions are the same as those for the simulation 1.

Figure 10:
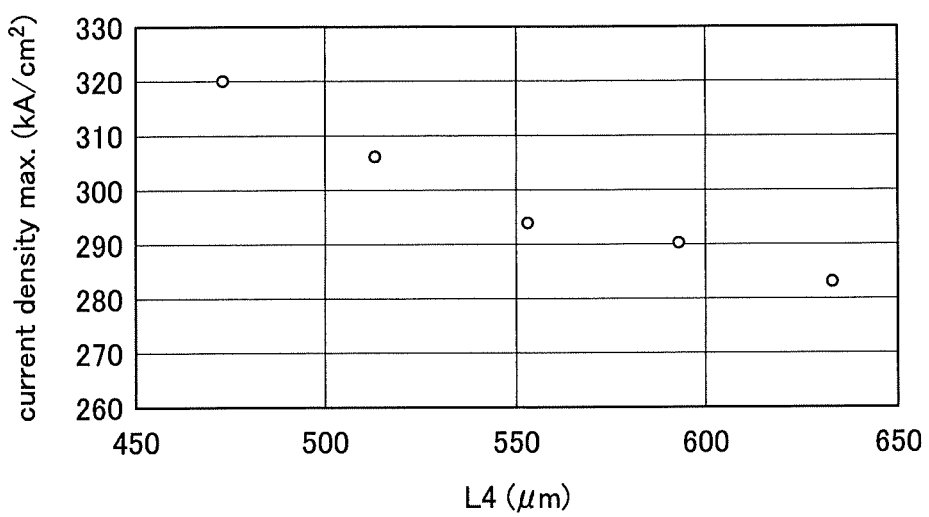
FIG. 10 is a graph illustrative of a result obtained in a simulation 2.

As a result of the simulation, a graph illustrated in FIG. 10 was obtained. In the graph in FIG. 10, the ordinate and the abscissa represent a maximum value of current density and L4, respectively.

The graph in FIG. 10 reveals that setting the lengths L2 and L4 so as to satisfy L4 553 μm, that is, L4≥L2, enables the maximum value of current density to be substantially reduced, that is, current concentration to be suppressed, as compared with the case where the lengths L2 and L4 are set so as to satisfy L4<L2.

<Simulation 3>

Figure 11:
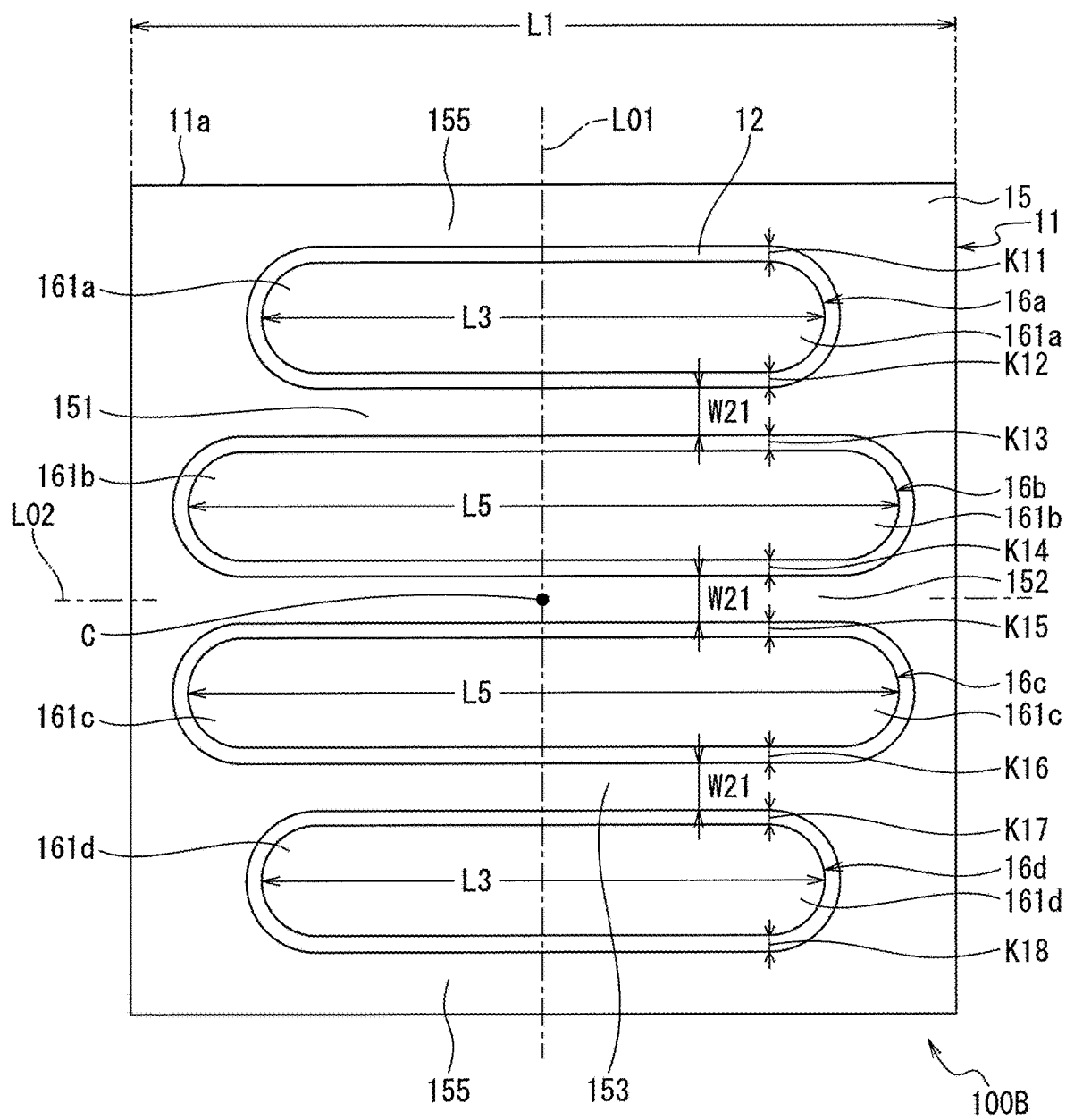
FIG. 11 is a plan view descriptive of a semiconductor chip (nitride semiconductor light emitting element) of a comparative example 3.

A simulation for assessing differences among the semiconductor chip 1 of the first example illustrated in FIG. 1, the semiconductor chip 1B of the third example illustrated in FIG. 4, the semiconductor chip 1C of the fourth example illustrated in FIG. 5, the semiconductor chip 1D of the fifth example illustrated in FIG. 6, and a semiconductor chip 100B of a comparative example 3 illustrated in FIG. 11 was conducted.

As illustrated in FIG. 11, the semiconductor chip 100B of the comparative example 3 has one n-type electrode 15 in place of five n-type electrodes 15a to 15e in the semiconductor chip 1 of the first example. The semiconductor chip 100B has the same features as the semiconductor chip 1 of the first example except this feature. The n-type electrode 15 has outer shape lines of openings extending along the outer shape lines of p-type electrodes 16a to 16d. That is, portions of the n-type electrode 15 exist on the outside of the p-type electrodes 16a to 16d in the direction (first direction) perpendicular to the direction (second direction) in which the p-type electrodes 16a to 16d are arranged.

The n-type electrode 15 has first belt-shaped portions 151 to 153 existing between pairs of p-type electrodes arranged next to each other among the p-type electrodes 16a to 16d and second belt-shaped portions 155 existing at both ends in the second direction. Width (a dimension in the second direction) W21 of each of the first belt-shaped portions 151 to 153 is the same as the width W2 of each of the n-type electrodes 15b to 15d in the semiconductor chip 1 of the first example.

A gap K11 between one of the second belt-shaped portions 155 and the p-type electrode 16a is the same as the gap K1 between the n-type electrode 15a and the p-type electrode 16a in the semiconductor chip 1 of the first example. A gap K12 between the p-type electrode 16a and the first belt-shaped portion 151 is the same as the gap K2 between the p-type electrode 16a and the n-type electrode 15b in the semiconductor chip 1 of the first example. A gap K13 between the first belt-shaped portion 151 and the p-type electrode 16b is the same as the gap K3 between the n-type electrode 15b and the p-type electrode 16b in the semiconductor chip 1 of the first example. A gap K14 between the p-type electrode 16b and the first belt-shaped portion 152 is the same as the gap K4 between the p-type electrode 16b and the n-type electrode 15c in the semiconductor chip 1 of the first example.

A gap K15 between the first belt-shaped portion 152 and the p-type electrode 16c is the same as the gap K5 between the n-type electrode 15c and the p-type electrode 16c in the semiconductor chip 1 of the first example. A gap K16 between the p-type electrode 16c and the first belt-shaped portion 153 is the same as the gap K6 between the p-type electrode 16c and the n-type electrode 15d in the semiconductor chip 1 of the first example. A gap K17 between the first belt-shaped portion 153 and the p-type electrode 16d is the same as the gap K7 between the n-type electrode 15d and the p-type electrode 16d in the semiconductor chip 1 of the first example. A gap K18 between the p-type electrode 16d and the other of the second belt-shaped portions 155 is the same as the gap K8 between the p-type electrode 16d and the n-type electrode 15e in the semiconductor chip 1 of the first example.

Note that, in the semiconductor chip 100B of the comparative example 3, projecting portions 161a to 161d at both ends in the longitudinal direction of the p-type electrodes 16a to 16d, respectively, are portions the outer shape lines of which extend along the outer shape lines of the openings of the n-type electrode 15, not separating portions.

Distributions of current density (the amount of current flowing per unit area in the direction perpendicular to the substrate 11) in the nitride semiconductor light emitting layers 13 right below the p-type electrodes 16a to 16d were simulated with respect to semiconductor chips corresponding to the semiconductor chip 1 of the first example, the semiconductor chip 1B of the third example, the semiconductor chip 1C of the fourth example, and the semiconductor chip 1D of the fifth example with L2, L3, L4, L5, W1, and W2 fixed to 553 µm, 553 µm, 633 µm, 633 µm, 25 µm, and 50 µm, respectively, and the semiconductor chip 100B of the comparative example 3 with L3 and L5 set at 553 µm and 633 µm, respectively.

Simulation conditions are the same for all cases except the above-described conditions. The simulation conditions are the same as those for the simulation 1.

Figure 12:
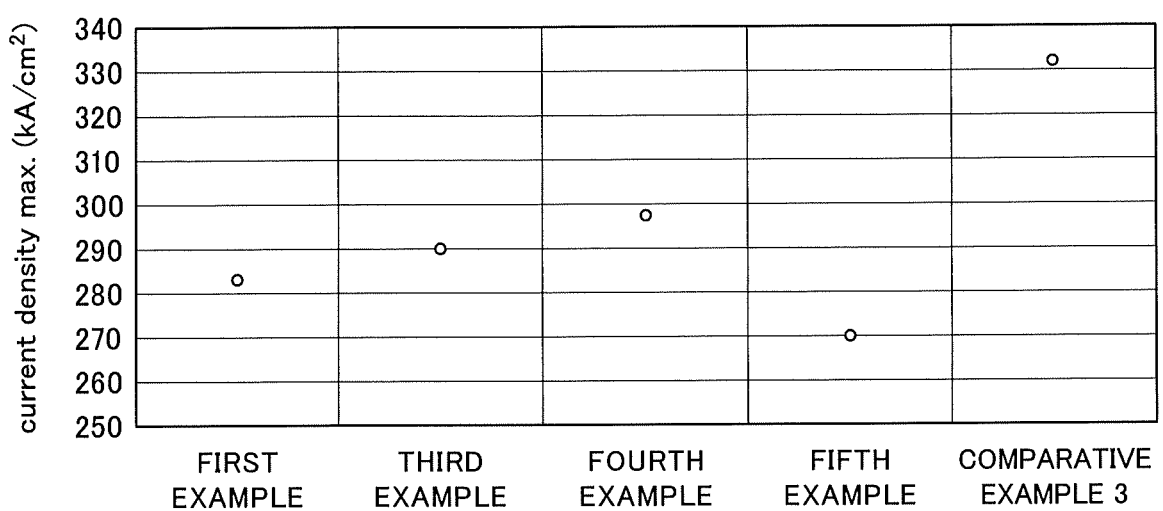
FIG. 12 is a graph illustrative of a result obtained in a simulation 3.

As a result of the simulation, a graph illustrated in FIG. 12 was obtained. In the graph in FIG. 12, the ordinate and the abscissa represent a maximum value of current density and types of the semiconductor chips, respectively.

The graph in FIG. 12 reveals that the semiconductor chips 1, 1B, 1C, and 1D of the first, third, fourth, and fifth examples enable the maximum value of current density to be substantially reduced, that is, current concentration to be suppressed, as compared with the semiconductor chip 100B of the comparative example 3. The suppression effect against current concentration was largest in the fifth example and decreased in the order of the first, third, and fourth examples. It was also revealed that, with regard to an electrode pair made up of the p-type electrode 16a on the edge side and the n-type electrode 15b arranged next thereto and on the inner side and an electrode pair made up of the p-type electrode 16d on the edge side and the n-type electrode 15d arranged next thereto and on the inner side, configuring end portions in the first direction of the p-type electrodes 16a and 16d to have separating portions on the sides where the n-type electrodes 15b and 15d in the respective electrode pairs were located, respectively, enabled the suppression effect against current concentration to be increased.

In the semiconductor chip 100B of the comparative example 3, current density was notably high at outer edge portions of the projecting portions 161a to 161d formed at both ends in the longitudinal direction of the p-type electrodes 16a to 16d, respectively. In the third and fourth examples, since the end portions in the first direction of the p-type electrodes 16a and 16d do not have separating portions on the sides where the n-type electrodes 15b and 15d in the respective electrode pairs are located, respectively, current concentration at the end portions was slightly larger than that in the first and fifth examples in which the end portions in the first direction of the p-type electrodes 16a and 16d have separating portions on the sides where the n-type electrodes 15b and 15d in the respective electrode pairs are located, respectively. In the comparison between the third and fourth examples, the suppression effect against current concentration was higher in the third example, in which separating portions are disposed to the p-type electrodes 16a and 16d arranged on the edge sides, than in the fourth example.

[Embodiments of Nitride Semiconductor Light Emitting Device]

Although embodiments of a nitride semiconductor light emitting device of the present invention will be described below, the present invention is not limited to the embodiments to be described below. Although the embodiments to be described below include limitations technically preferable for embodying the present invention, the limitations are not indispensable requirements for the present invention.

First Embodiment

[Overall Configuration]

Figure 13:
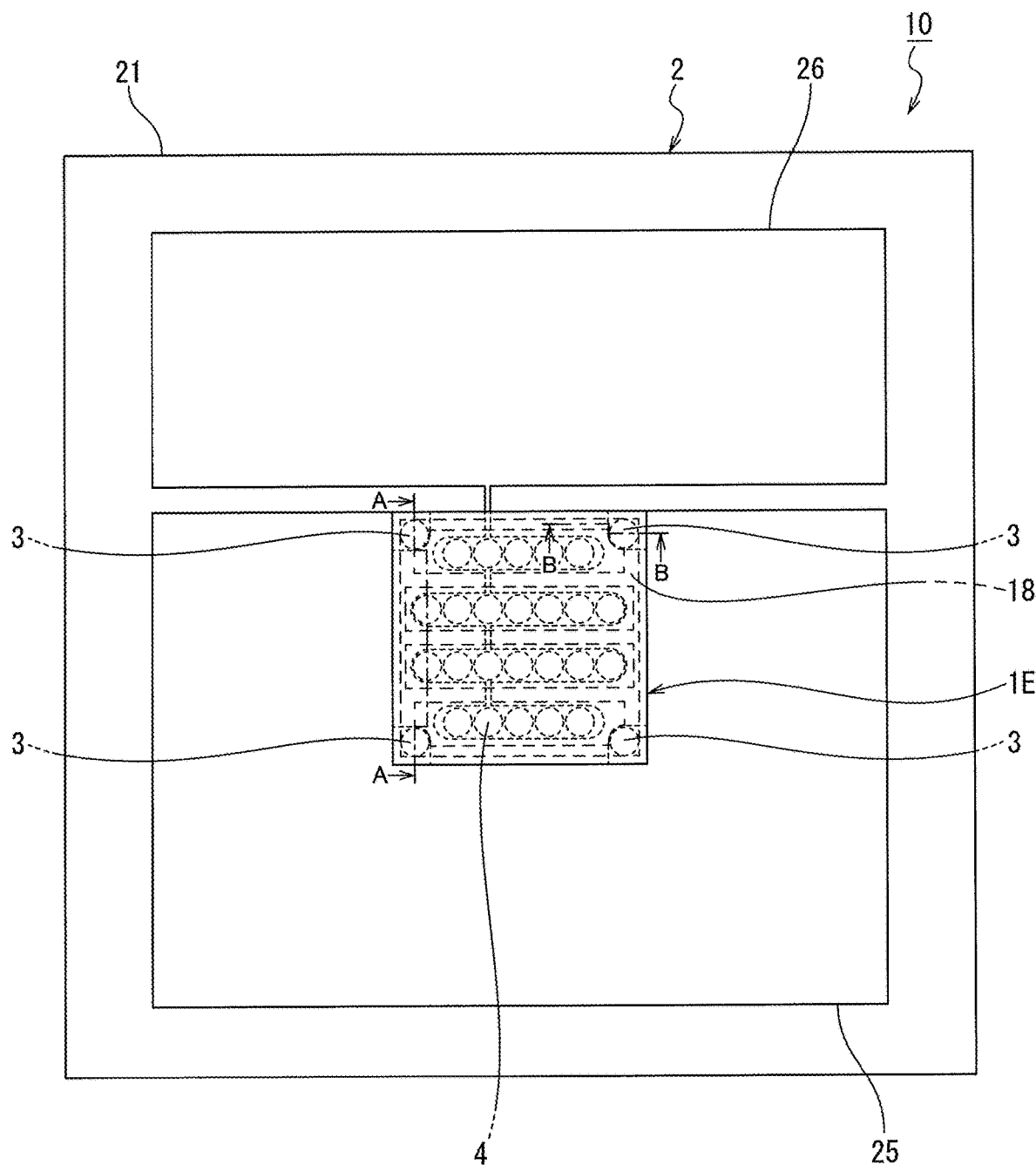
FIG. 13 is a plan view illustrative of a nitride semiconductor light emitting device corresponding to embodiments of the present invention.

As illustrated in FIG. 13, a nitride semiconductor light emitting device 10 of a first embodiment includes a semiconductor chip (nitride semiconductor light emitting element) 1E, a package substrate (base body) 2, first connecting bodies 3, and second connecting bodies 4.

[Semiconductor Chip]

Figure 14:
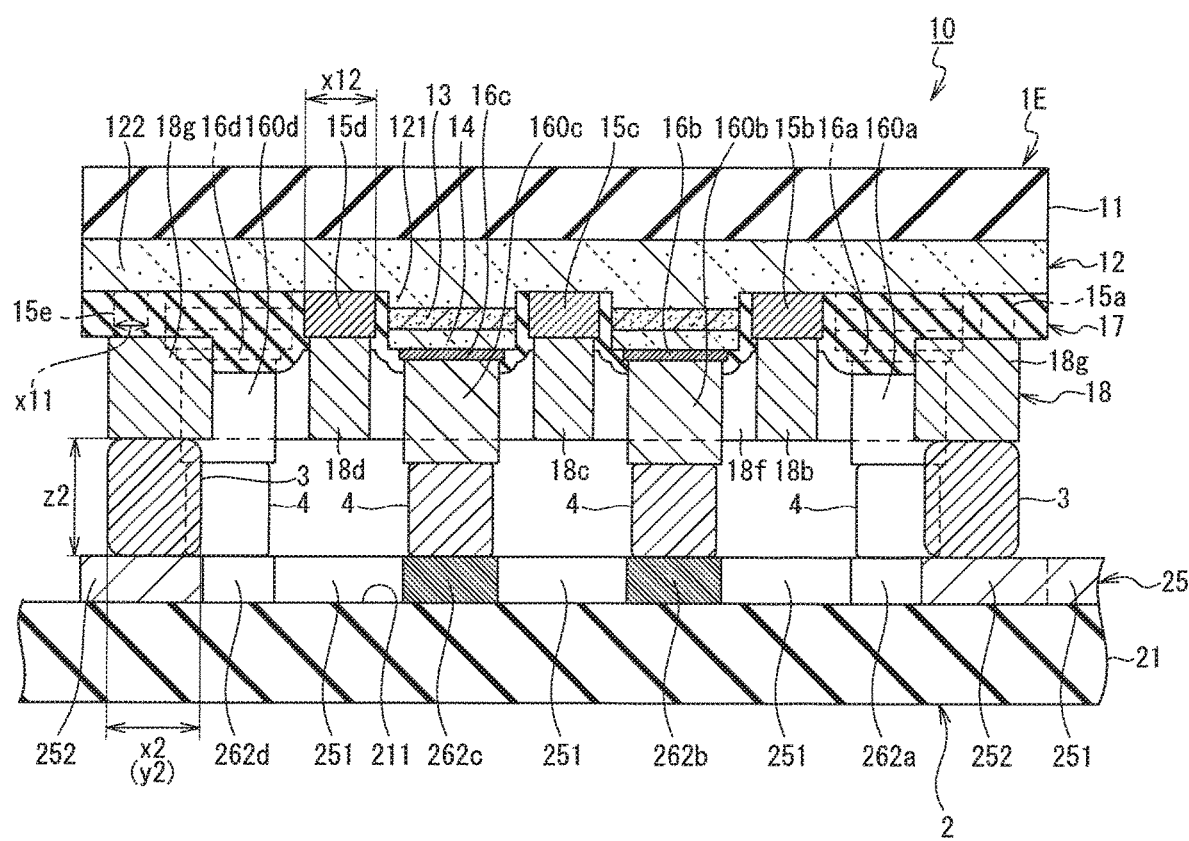
FIG. 14 is a partial cross-sectional view of FIG. 13 and illustrates a diagram corresponding to an A-A cross-section of FIG. 13.
Figure 15:
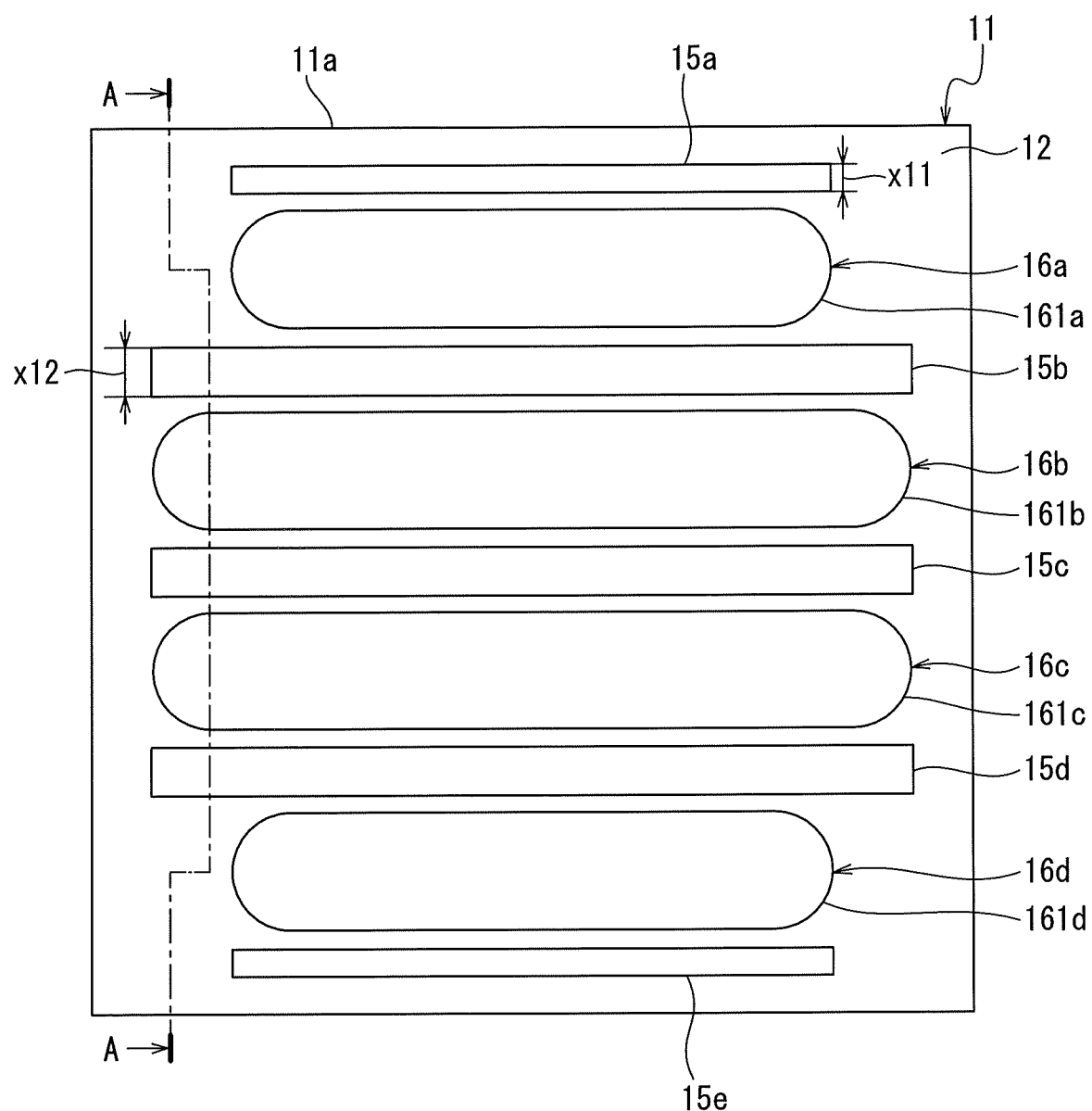
FIG. 15 is a plan view illustrative of an electrode arrangement of a nitride semiconductor light emitting element constituting the nitride semiconductor light emitting device in FIG. 13.
Figure 16:
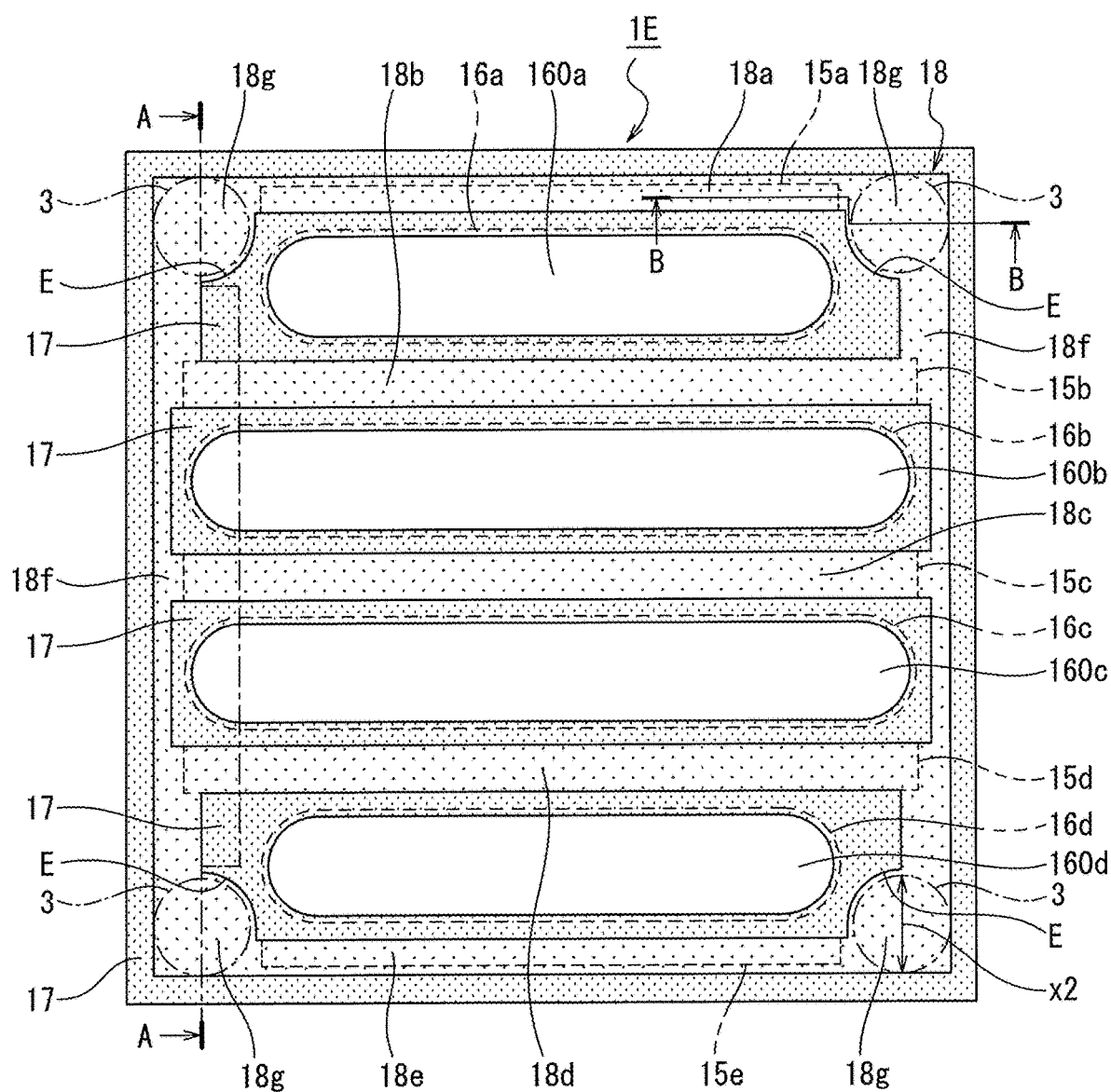
FIG. 16 is a plan view illustrative of the nitride semiconductor light emitting element constituting the nitride semiconductor light emitting device in FIG. 13.

As illustrated in FIGS. 14 to 16, the semiconductor chip 1E includes a substrate 11, an n-type nitride semiconductor layer 12, nitride semiconductor light emitting layers 13, p-type nitride semiconductor layers 14, n-type electrodes (first electrodes) 15a to 15e, p-type electrodes (second electrodes) 16a to 16d, pad electrodes 160a to 160d, an insulating layer 17, and a wiring layer 18.

As illustrated in FIG. 2, the n-type nitride semiconductor layer 12 is formed on one surface 110 of the substrate 11. The n-type nitride semiconductor layer 12 includes thick portions 121 and a thin portion 122 that is a portion other than the thick portions 121. The nitride semiconductor light emitting layers 13 are formed on the thick portions 121 of the n-type nitride semiconductor layer 12. The p-type nitride semiconductor layers 14 are formed on the nitride semiconductor light emitting layers 13.

The semiconductor chip 1E is an ultraviolet light emitting element that emits ultraviolet light having a wavelength in a range of 200 nm or longer and 360 nm or shorter. The substrate 11 is an AlN substrate. The n-type nitride semiconductor layer 12 is an n-AlGaN layer. Each nitride semiconductor light emitting layer 13 is a layer having a multiple quantum well (MQW) structure constituted by a quantum well layer made of AlGaN and an electron barrier layer made of AlGaN. Each p-type nitride semiconductor layer 14 is a p-GaN layer.

The n-type electrodes 15a to 15e are formed on the thin portion 122 of the n-type nitride semiconductor layer 12. The p-type electrodes 16a to 16d are formed on the p-type nitride semiconductor layers 14. The pad electrodes 160a to 160d are formed on the p-type electrodes 16a to 16d, respectively.

The insulating layer 17 insulates the thick portions 121 of the n-type nitride semiconductor layer 12, the nitride semiconductor light emitting layers 13, the p-type nitride semiconductor layers 14, and the p-type electrodes 16a to 16d from the n-type electrodes 15a to 15e. The wiring layer 18 is formed on a portion of the insulating layer 17 and the n-type electrodes 15a to 15e. The wiring layer 18 is formed of a metal material, such as Au, Ag, Al, Cu, W, Mo, Ni, Pt, and Cr.

As illustrated in FIG. 15, the substrate 11 of the semiconductor chip 1E is shaped into a square in plan view, and the n-type nitride semiconductor layer 12 is formed on the whole of a surface of the substrate 11. The n-type electrodes 15a to 15e and the p-type electrodes 16a to 16d are arranged alternately in parallel with one another with gaps interposed therebetween in plan view.

The planar shapes of the n-type electrodes 15a to 15e are elongated rectangles, the long sides of which are parallel with first sides (sides extending in the right and left direction in FIG. 15) 11a of the square shaping the substrate 11. The planar shapes of the p-type electrodes 16a to 16d are rectangles the short sides of which are longer than those of the n-type electrodes 15a to 15e and, at both end portions in the long side direction (longitudinal direction) thereof, have projecting portions 161a to 161d that have semicircular arc (curved line) shapes, respectively. The n-type electrodes 15a to 15e and the p-type electrodes 16a to 16d are arranged with the long sides thereof in parallel with each other.

Among the n-type electrodes 15a to 15e, width (a dimension of short sides) x11 of rectangles shaping the n-type electrodes 15a and 15e (first electrodes not sandwiched by second electrodes), which are arranged at positions closest to edge portions located along the the first sides 11a (along the longitudinal direction of belt shapes) in the surface of the first nitride semiconductor layer 12, is narrower than width x12 of rectangles shaping the n-type electrodes 15b to 15d (first electrode sandwiched by second electrodes), which are arranged on the center side (the side away from the edge portions) of the n-type electrodes 15a and 15e in the surface of the first nitride semiconductor layer 12.

The n-type electrodes 15a and 15e have the same planar shape and dimension, and the n-type electrodes 15b to 15d have the same planar shape and dimension. The p-type electrodes 16a and 16d have the same planar shape and dimension, and the p-type electrodes 16b and 16c have the same planar shape and dimension.

The arrangement in plan view and the planar shapes of the n-type electrodes 15a to 15e and the p-type electrodes 16a to 16d of the semiconductor chip 1E are the same as those of the semiconductor chip 1 in FIG. 1, and the dimension x12 in the second direction of the first electrodes sandwiched by second electrodes is greater than the dimension x11 in the second direction of the first electrodes not sandwiched by second electrodes.

Figure 18:
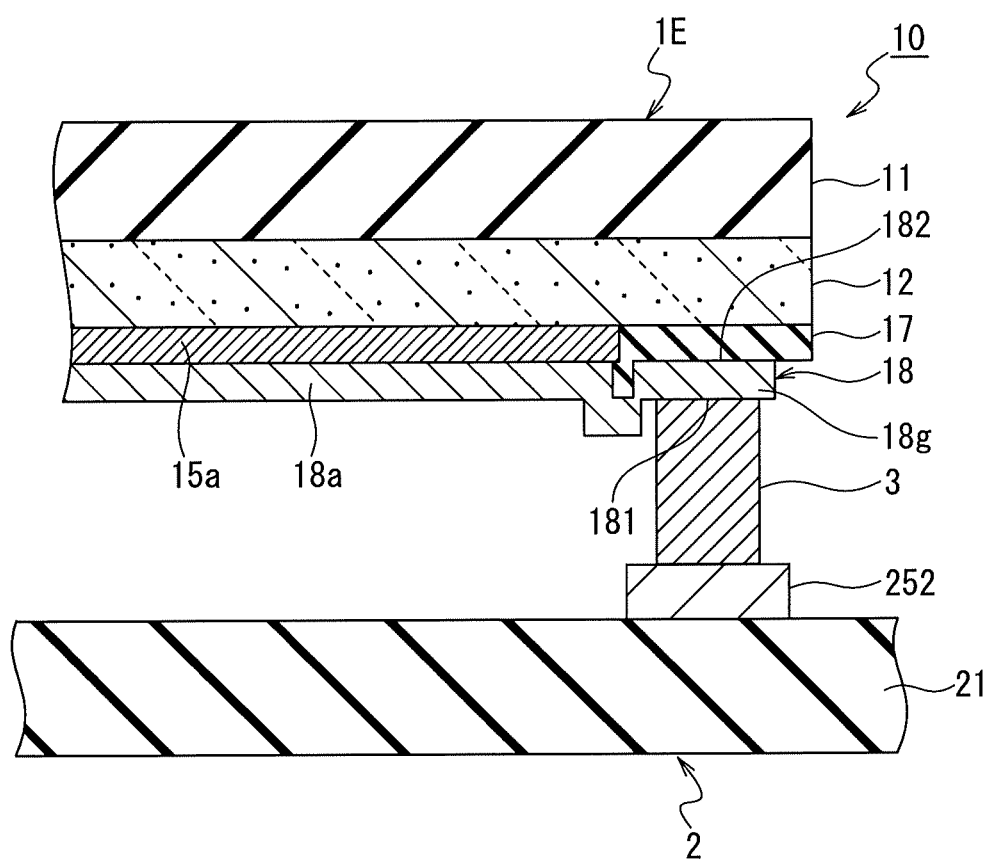
FIG. 18 is a partial cross-sectional view of FIG. 13 in a nitride semiconductor light emitting device of a first embodiment and illustrates a diagram corresponding to a B-B cross-section of FIG. 13.

As illustrated in FIG. 16, the wiring layer 18 has a planar shape in which longitudinal end portions of belt-shaped portions 18a to 18e that correspond to the n-type electrodes 15a to 15e, respectively, are connected to one another by a pair of side portions 18f and four corner portions 18g. The corner portions 18g have circular arc-shaped lines E that project toward the p-type electrode 16a or 16d. As illustrated in FIGS. 14 and 18, the side portions 18f and the corner portions 18g are formed on the n-type nitride semiconductor layer 12 with the insulating layer 17 interposed therebetween, and the belt-shaped portions 18a to 18e are formed directly on the n-type electrodes 15a to 15e, respectively.

That is, the belt-shaped portions 18a to 18e of the wiring layer 18 are portions (first portions) formed on the n-type electrodes 15a to 15e, respectively, and the side portions 18f and the corner portions 18g of the wiring layer 18 are portions (second portions) formed on portions that are neither the n-type electrodes 15a to 15e nor the p-type electrodes 16a to 16d. In addition, the wiring layer 18 does not have portions formed on the p-type electrodes 16a to 16d.

[Package Substrate]

Figure 17:
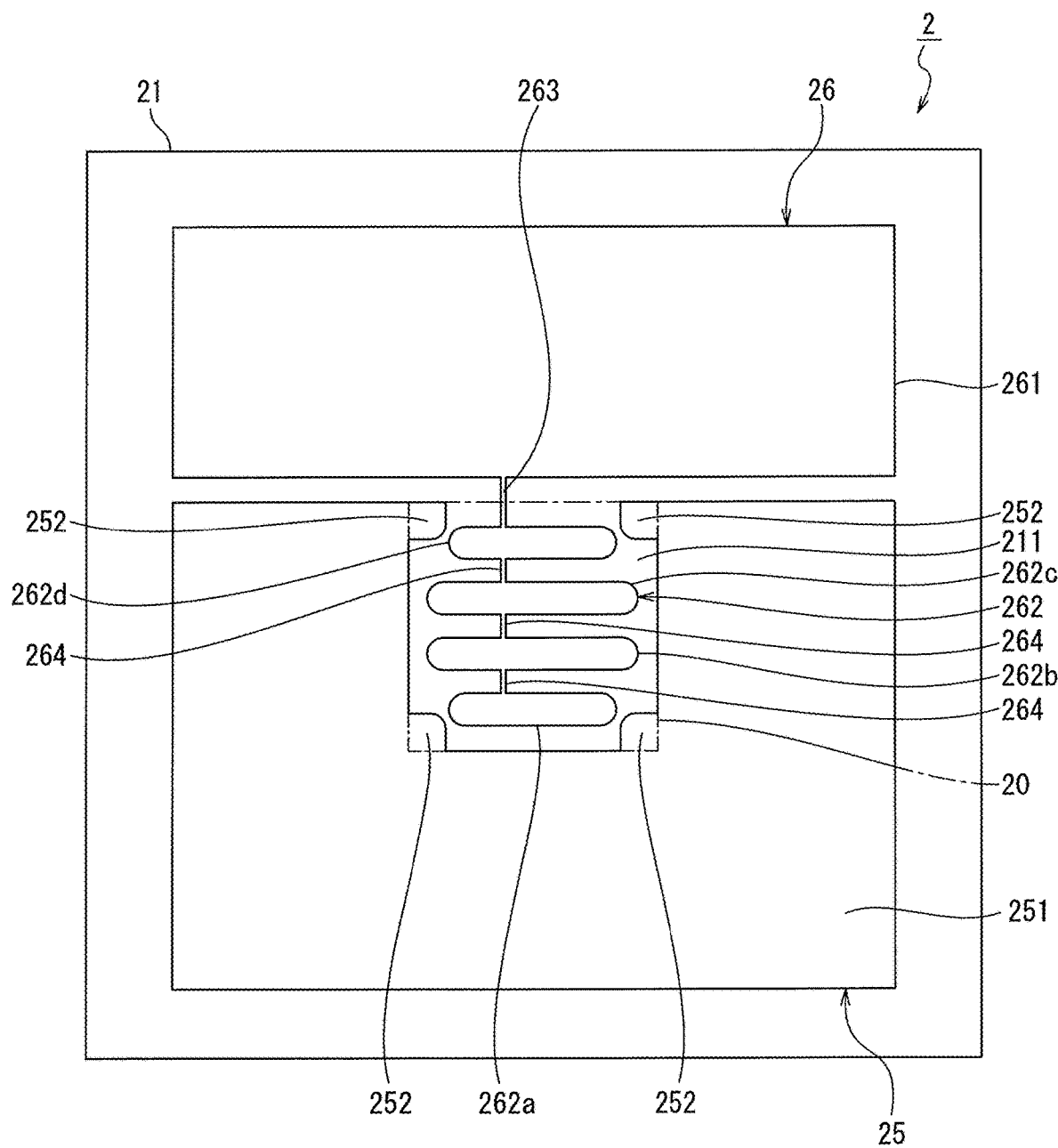
FIG. 17 is a plan view illustrative of a base body constituting the nitride semiconductor light emitting device in FIG. 13.

As illustrated in FIGS. 14 and 17, the package substrate 2 has a facing surface 211 that faces a surface of the semiconductor chip 1 on which the n-type electrodes and the p-type electrodes are formed.

The package substrate 2 also has an insulating substrate 21 and an n-type electrode 25 and a p-type electrode 26 that are formed on the facing surface 211 of the insulating substrate 21. The n-type electrode 25 includes a base portion 251 and four connection portions 252. The p-type electrode 26 includes a base portion 261, connection portions 262, and linking portions 263 and 264.

A central portion 20, which has a square shape in plan view, of the package substrate 2 is a portion at which the semiconductor chip 1 is arranged. In an area including the central portion 20, the connection portions 252 of the n-type electrode 25 and the connection portions 262 of the p-type electrode 26 are formed. The base portion 251 of the n-type electrode 25 is arranged on the outside that surrounds the sides of the square shaping the central portion 20 except a side that is the top side in FIG. 17. The four connection portions 252 of the n-type electrode 25 are arranged at positions corresponding to the four corner portions 18g of the wiring layer 18 illustrated in FIG. 16.

The base portion 261 of the p-type electrode 26 is arranged at a position located on the upper side of the base portion 251 of the n-type electrode 25 in FIG. 17. The package substrate 2 has, as the connection portions 262 of the p-type electrode 26, four belt-shaped portions 262a to 262d that are arranged at positions overlapping the p-type electrodes 16a to 16d of the semiconductor ship 1E, respectively. The linking portion 263 links the base portion 261 and the belt-shaped portion 262d among the connection portions 262 of the p-type electrode 26 to each other. The linking portions 264 link the belt-shaped portions 262a, 262b, and 262c to the belt-shaped portions 262b, 262c, and 262d, respectively.

[First Connecting Body and Second Connecting Body and Connection of Semiconductor Chip and Package Substrate Thereby]

As illustrated in FIG. 14, the first connecting bodies 3 electrically connect the corner portions (second portions) 18g of the wiring layer 18 and the connection portions 252 of the n-type electrode (third electrode) 250 of the package substrate 2 to each other.

The second connecting bodies 4 electrically connect the p-type electrodes (second electrodes) 16a to 16d of the semiconductor chip 1E and the belt-shaped portions 262a to 262d of the p-type electrode (fourth electrode) 260 of the package substrate 2 to each other, respectively. That is, by means of the first connecting bodies 3 and the second connecting bodies 4, the semiconductor chip 1E is flip-chip mounted on the package substrate 2. The first connecting bodies 3 and the second connecting bodies 4 are bumps formed of gold or an alloy containing gold.

The first connecting bodies 3 are formed at positions that do not face the n-type electrodes 15b to 15d. That is, the n-type electrodes 15b to 15d do not exist right above the first connecting bodies 3. The n-type electrodes 15b to 15d of the semiconductor chip 1E and the connection portions 252 of the n-type electrode 25 of the package substrate 2 are connected to each other indirectly, instead of directly, via the wiring layer 18.

Height z2 of each first connecting body 3 is greater than diameter (short diameter x2 and long diameter y2 of the first connecting body in plan view) of a circle shaping the first connecting body 3.

As illustrated in FIG. 18, in the nitride semiconductor light emitting device 10, each reverse side 182 of a site 181 of the wiring layer 18, the site 181 being in contact with one of the first connecting bodies 3, is in contact with the insulating layer 17.

[Relationship Between First Electrodes and First Connecting Bodies]

The width x11 of rectangles shaping the n-type electrodes 15a and 15e is equivalent to short diameter of the n-type electrodes 15a and 15e in plan view. The width x12 of rectangles shaping the n-type electrodes 15b to 15d is equivalent to short diameter of the n-type electrodes 15b to 15d in plan view. As illustrated in FIG. 16, the n-type electrodes 15a and 15e are n-type electrodes that are arranged at positions closest to portions where the first connecting bodies 3 are formed and the width (short diameter) x11 of which is less than the diameter (short diameter) x2 of circles shaping the first connecting bodies 3, the planar shapes of which are circles. In addition, the short diameter x2 of the first connecting bodies 3 is less than 50 μm. Moreover, the width x12 of the n-type electrodes 15b to 15d is less than the short diameter x2 of the first connecting bodies 3. Further, a ratio (S2/S1) of contact area S2 of the first connecting bodies 3 to the wiring layer 18 (four times the area of the circle) to the total area S1 of the n-type electrodes 15a to 15e is 0.25 or greater and less than 3.0.

[Manufacturing Method of Nitride Semiconductor Light Emitting Device of Embodiment]

The nitride semiconductor light emitting device 10 of the embodiment can be manufactured using a method described below.

First, on one surface of the substrate 11, the n-type nitride semiconductor layer 12, the nitride semiconductor light emitting layer 13, and the p-type nitride semiconductor layer 14 are formed in this sequence. Next, mesa etching is performed on the stacked body constituted by the n-type nitride semiconductor layer 12, the nitride semiconductor light emitting layer 13, and the p-type nitride semiconductor layer 14, and four projecting portions are thereby formed in planar shapes corresponding to the planar shapes of the p-type electrodes 16a to 16d illustrated in FIG. 15. Removal of a portion of the stacked body down to an intermediate level in the thickness direction of the n-type nitride semiconductor layer 12 by means of the mesa etching causes the thin portion 122 to be formed to the n-type nitride semiconductor layer 12.

Next, in the planar shapes and planar arrangement illustrated in FIG. 15, the n-type electrodes 15a to 15e and the p-type electrodes 16a to 16d are formed on the thin portion 122 of the n-type nitride semiconductor layer 12 and the p-type nitride semiconductor layers 14 of the respective projecting portions, respectively.

Figure 19:
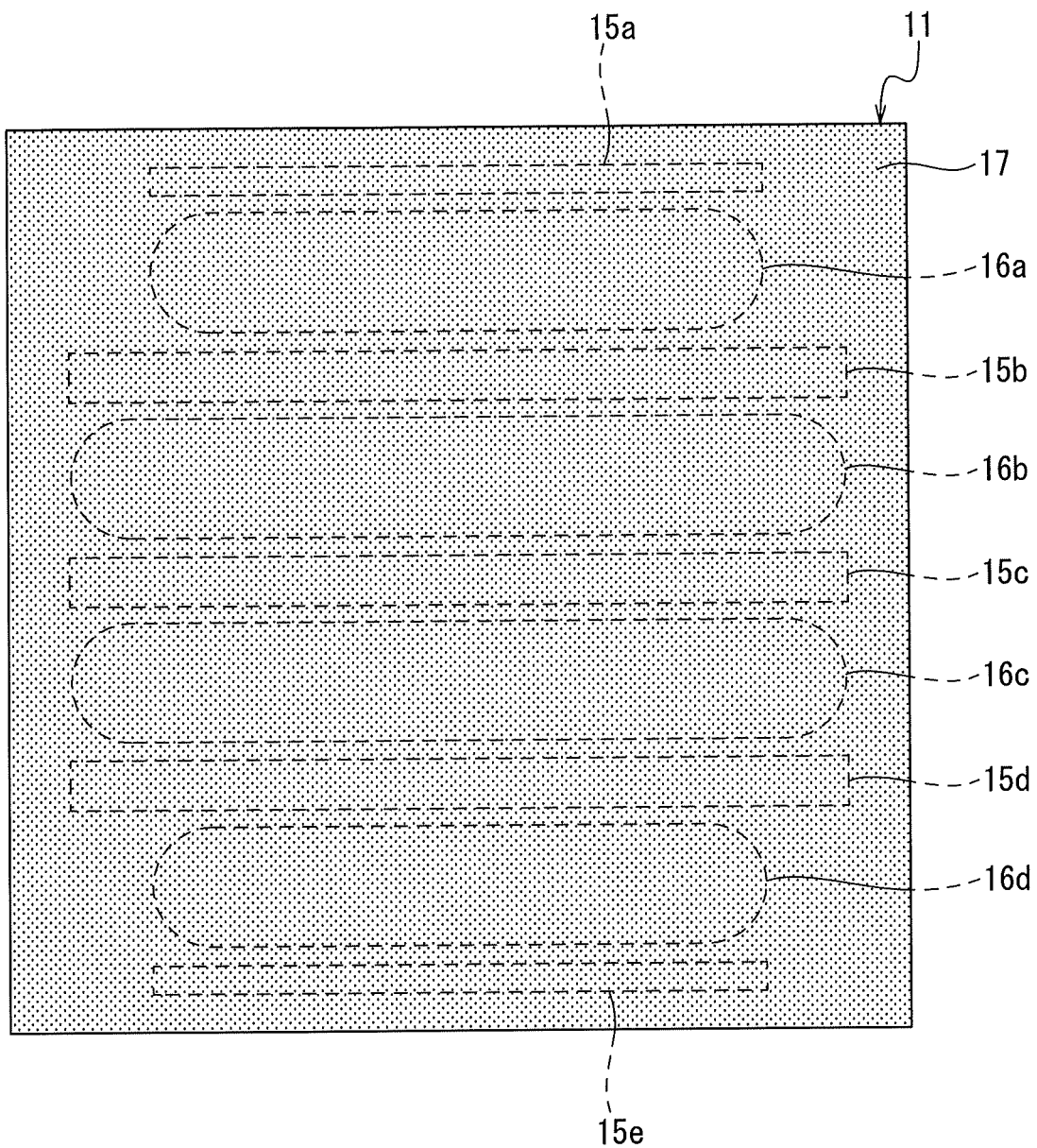
FIG. 19 is a plan view illustrative of a state after an insulating layer forming step.

Next, on the whole upper surface of the substrate 11 that is in a condition illustrated in FIG. 15, that is, on the n-type nitride semiconductor layer 12, the n-type electrodes 15a to 15e, and the p-type electrodes 16a to 16d, the insulating layer 17 is formed. FIG. 19 illustrates the condition after this step.

Figure 20:
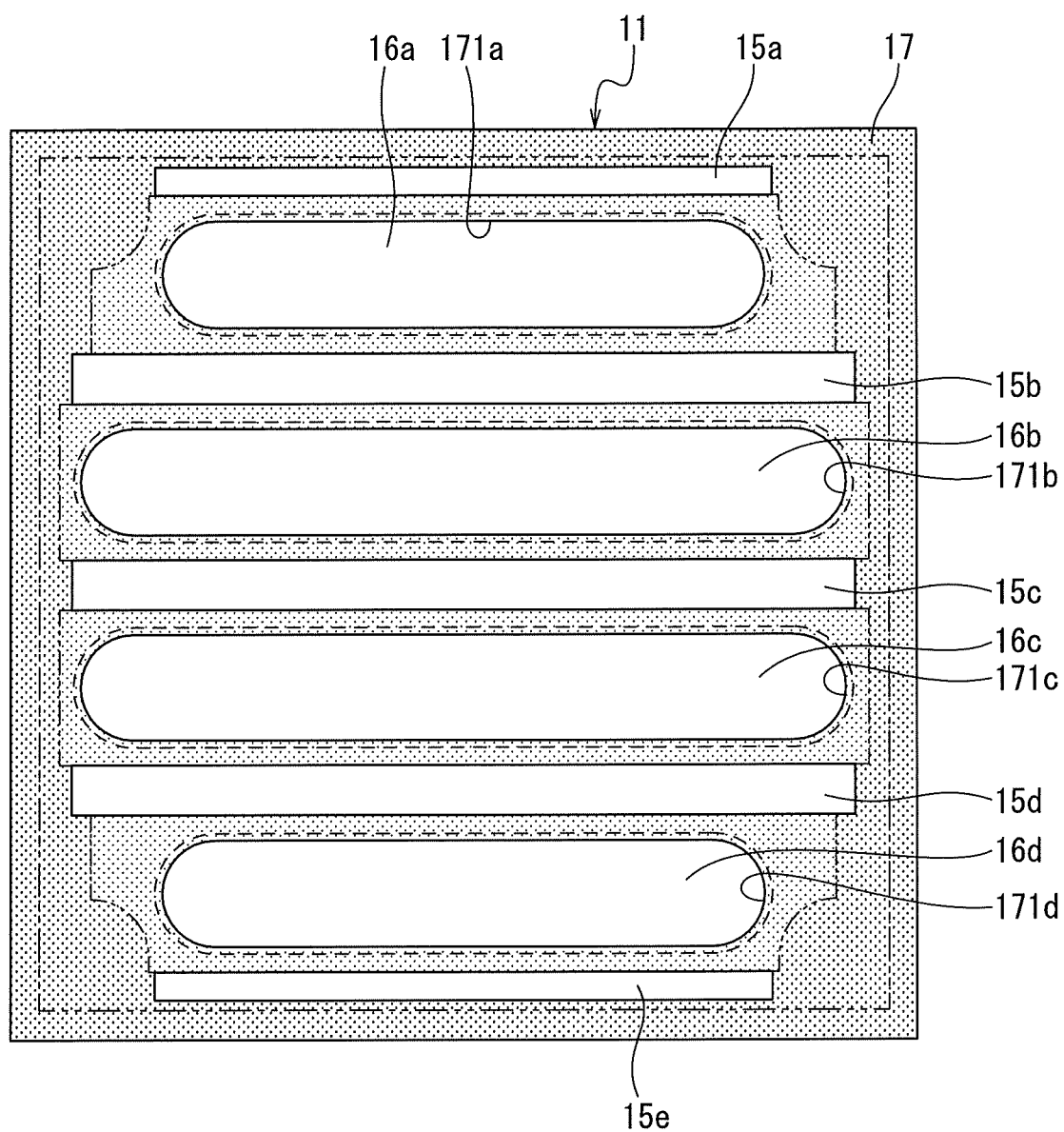
FIG. 20 is a plan view illustrative of a state after a removal step (exposure step) of a portion of the insulating layer.

Next, portions of the insulating layer 17 are removed, and portions of the upper surfaces of the n-type electrodes 15a to 15e and the p-type electrodes 16a to 16d are thereby exposed. Portions of the insulating layer 17 on the p-type electrodes 16a to 16d are removed in such a way as to form holes 171a to 171d that are shaped by lines extending along and on the slightly inner side of the outer shape lines of the p-type electrodes 16a to 16d, respectively. FIG. 20 illustrates the condition after this step.

Next, on the substrate 11 that is in the condition illustrated in FIG. 20, the pad electrodes 160a to 160d are formed on the p-type electrodes 16a to 16d (inside the holes 171a to 171d), respectively, and, in conjunction therewith, the wiring layer 18 is formed on a portion enclosed by two-dot chain lines on the insulating layer 17 and the n-type electrodes 15a to 15e. The above process produces the semiconductor chip 1E illustrated in FIG. 16. In practice, since a lot of semiconductor chips 1E are formed in plan view on a single substrate, the process includes a step in which the substrate is separated into individual semiconductor chips 1E.

Figure 21:
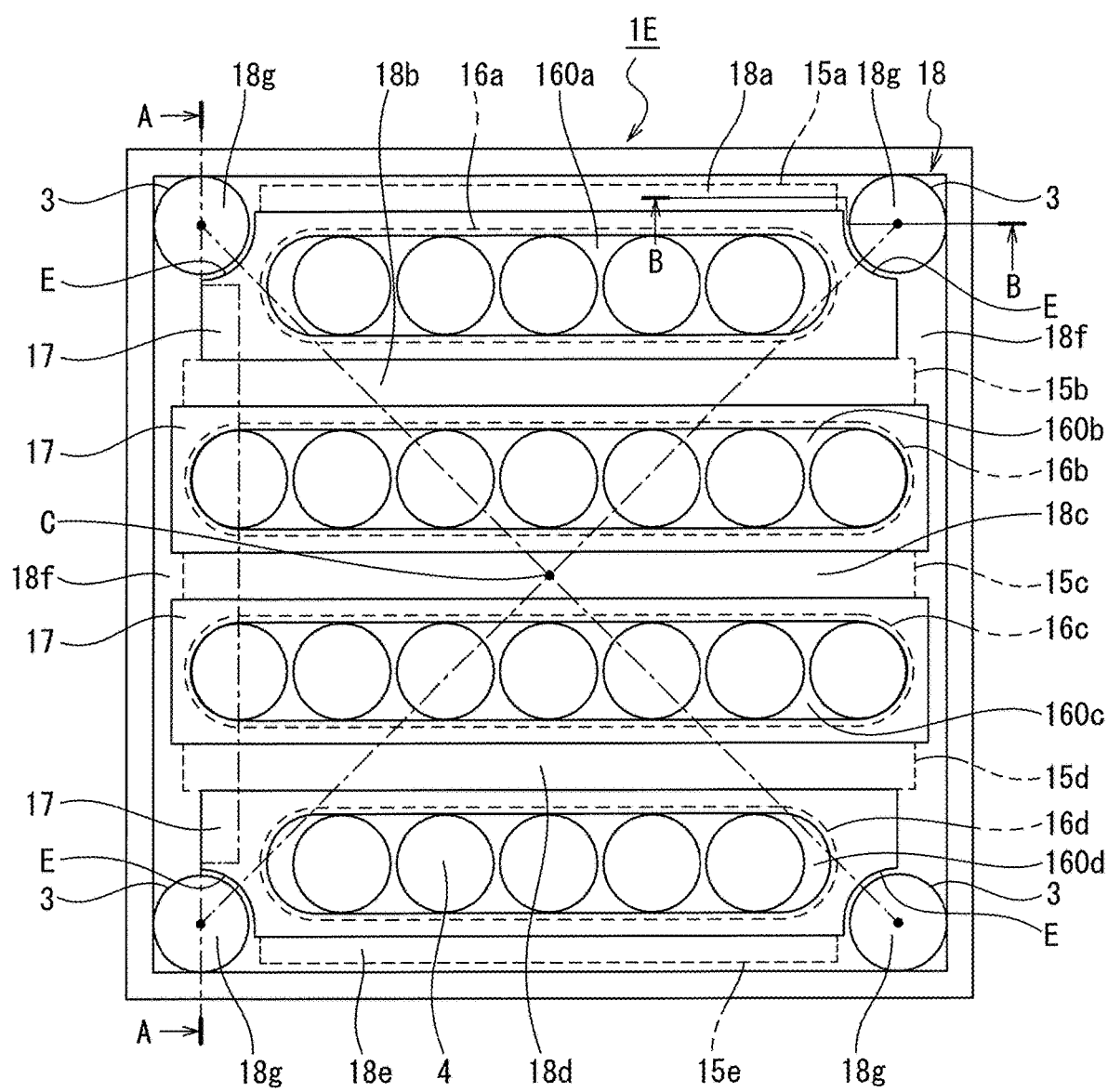
FIG. 21 is a plan view illustrative of a state in which first and second connecting bodies are formed on the nitride semiconductor light emitting element in FIG. 16.

Next, the first connecting bodies 3 are respectively formed on the four corner portions 18g of the wiring layer 18, and the second connecting bodies 4 are formed on the pad electrodes 160a to 160d. FIG. 21 illustrates the condition after this step. As illustrated in FIG. 21, the four first connecting bodies 3 arranged on the four corner portions 18g are positioned, in plan view, at the same distance from the center (centroid) C of the semiconductor chip 1E.

Next, the semiconductor chip 1E is arranged in such a way that the first connecting bodies 3 and the second connecting bodies 4 face the facing surface 211 of the package substrate 2, and, by means of ultrasonic bonding, the first connecting bodies 3 and the second connecting bodies 4 are fixed to the n-type electrodes (third electrodes) 252 and the p-type electrodes (fourth electrodes) 262a to 262d of the package substrate 2, respectively. That is, the semiconductor chip 1E is flip-chip mounted on the package substrate 2.

The above process causes the n-type electrodes 15a to 15e formed on the semiconductor chip 1E to be electrically connected to the n-type electrodes (third electrodes) 252 of the package substrate 2 via the wiring layer 18 and the p-type electrodes 16a to 16d formed on the semiconductor chip 1E to be electrically connected to the p-type electrodes (fourth electrodes) 262a to 262d of the package substrate 2, respectively. In consequence, the nitride semiconductor light emitting device 10 illustrated in FIGS. 13 and 14 is produced.

[Actions and Advantageous Effects of Nitride Semiconductor Light Emitting Device of Embodiment]

<Background Art and Problem>

In PTL 1, an invention with the aim of more efficiently radiating waste heat generated in association with light emission by a nitride semiconductor ultraviolet light emitting element, produced by flip chip mounting, is disclosed. Specifically, for example, a p-type electrode is, in plan view, formed into a shape in which each pair of belt-shaped portions arranged next to each other among a plurality of belt-shaped portions arranged in parallel with one another are linked to each other, and an n-type electrode is, in plan view, formed between the belt-shaped portions and around the peripheral portion of the p-type electrode. A continuous first plating electrode is formed over portions of the n-type electrode between the belt-shaped portions with a protection insulating film interposed therebetween and on the p-type electrode through an opening portion opened to the protection insulating film. The first plating electrode is made of copper or an alloy containing copper as a principal component.

In addition, second plating electrodes that are connected to a peripheral portion of the n-type electrode are disposed to positions in four corner portions of the substrate in plan view, and the first plating electrode and the second plating electrodes are soldered to a first electrode pad and a second electrode pad on a base body (sub-mount), respectively.

Since, as described above, forming the first plating electrode, which is made of copper or an alloy containing copper as a principal component, also over portions of the n-type electrode between the belt-shaped portions of the p-type electrode with the protection insulating film interposed therebetween enables a large contact area to be secured between the first plating electrode and the electrode pad on the package side in a case of flip chip mounting, a substantial improvement in heat radiation effect is expected to be achieved.

However, in the nitride semiconductor device described in PTL 1, there is a possibility that, when a crack is generated on the protection insulating film, portions of the n-type electrode between the belt-shaped portions of the p-type electrode and the first plating electrode are short-circuited to each other, and, thus, there is room for improvement in terms of reliability.

<Actions and Advantageous Effects of Embodiment>

In the nitride semiconductor light emitting device 10 of the embodiment, the first connecting bodies 3 are formed at positions that do not face the n-type electrodes 15a to 15e. In addition, the corner portions (second portions) 18g of the wiring layer 18 and the connection portions 252 of the n-type electrode 25 of the package substrate 2 are connected to each other by the first connecting bodies 3. This configuration enables the nitride semiconductor light emitting device 10 to be more unlikely to cause a short-circuit defect and to have higher reliability than the nitride semiconductor light emitting device described in PTL 1. In addition, by providing the nitride semiconductor light emitting device 10 with the wiring layer 18, improvement in heat radiation effect can be expected.

While, when the short diameter x11 of the n-type electrodes 15a and 15e is less than the short diameter x2 of the first connecting bodies 3, the first connecting bodies 3 and the n-type electrodes 15a and 15e are in a relationship in which a portion of the shape of each first connecting body 3 protrudes to the outside of the shape of the n-type electrode 15a or 15e, when the first connecting bodies 3 are formed at positions that face the n-type electrode 15a or 15e, the protruding portions become likely to be displaced from correct positions and come into contact with the pad electrode 160a or 160d of the p-type electrode, which causes short-circuit risk to be increased. There is also a risk that an electric field being provided to the protruding portions may cause an element breakdown and the like due to electromigration (a phenomenon where metal atoms migrate due to high density current) to occur in a region other than a wiring region.

On the other hand, in the nitride semiconductor light emitting device 10 of the embodiment, since the first connecting bodies 3 are formed at positions that do not face the n-type electrodes 15a and 15e, the above-described short-circuit risk, element breakdown risk, and the like are reduced. That is, the nitride semiconductor light emitting device of the one aspect provides a particularly great effect when short diameter of a first electrode arranged at a position closest to a portion where a first connecting body is formed is less than short diameter of the first connecting body (when, for example, a difference between the short diameters is greater than 0 and less than 20 µm). In addition, since setting a difference between the short diameters at less than 20 µm enables the first electrodes and the first connecting bodies to be arranged with high dimensional accuracy, variation in mass production can be suppressed.

In addition, in the nitride semiconductor light emitting device 10 of the embodiment, the short diameters x11 and x12 of the n-type electrodes 15a to 15e being less than the short diameter x2 of the first connecting bodies 3 enables current and heat to be prevented from locally concentrating inside the first connecting bodies 3.

Since the four first connecting bodies 3 arranged on the four corner portions 18g are positioned, in plan view, at the same distance from the center (centroid) C of the semiconductor chip 1E, current flows uniformly in each of the n-type electrodes 15a to 15e.

Further, since a ratio (S2/S1) of contact area S2 of the first connecting bodies 3 to the wiring layer 18 (four times the area of a circle) to the total area S1 of the n-type electrodes 15a to 15e is 0.25 or more and less than 3.0, the nitride semiconductor light emitting device 10 of the embodiment excels in connection strength and uniformity of current density.

Second Embodiment

Figure 22:
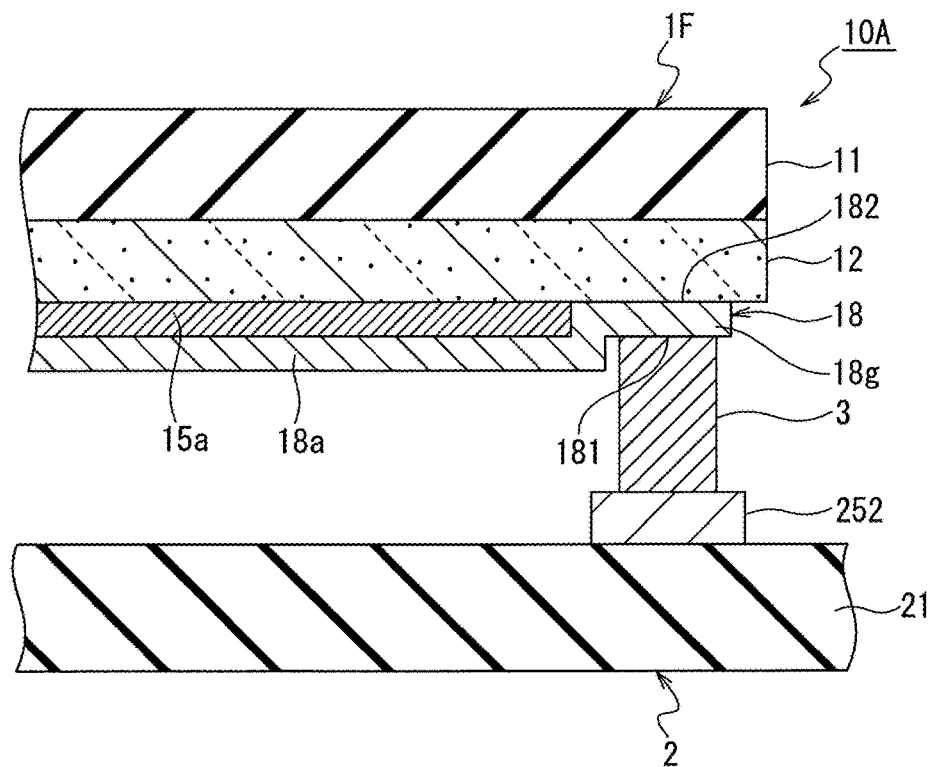
FIG. 22 is a partial cross-sectional view of FIG. 13 in a nitride semiconductor light emitting device of a second embodiment and illustrates a diagram corresponding to the B-B cross-section of FIG. 13.

As illustrated in FIG. 22, in a nitride semiconductor light emitting device 10A of a second embodiment, an insulating layer 17 does not exist between a wiring layer 18 and an n-type nitride semiconductor layer 12 that constitute a semiconductor chip 1F. That is, in the nitride semiconductor light emitting device 10A, each reverse side 182 of a site 181 of the wiring layer 18, the site 181 being in contact with one of first connecting bodies 3, is in contact with the n-type nitride semiconductor layer 12.

The nitride semiconductor light emitting device 10A of the second embodiment is the same as the nitride semiconductor light emitting device 10 of the first embodiment except the feature described above.

Because of this difference, the nitride semiconductor light emitting device 10A of the second embodiment provides an advantageous effect that the non-existence of the insulating layer 17 enables the wiring layer 18 formed of a metal material and the n-type nitride semiconductor layer 12 to be suppressed from locally peeling off from each other, in addition to the same advantageous effects as those of the nitride semiconductor light emitting device 10 of the first embodiment. The nitride semiconductor light emitting device 10A of the second embodiment also provides another advantageous effect that the non-existence of the insulating layer 17 on each reverse side 182 of the site 181 of the wiring layer 18, the site 181 being in contact with one of the first connecting bodies 3, enables the insulating layer 17 to be suppressed from breaking into particles when the first connecting bodies 3 are formed and the particles to be suppressed from causing an element defect.

Third Embodiment

Figure 23:
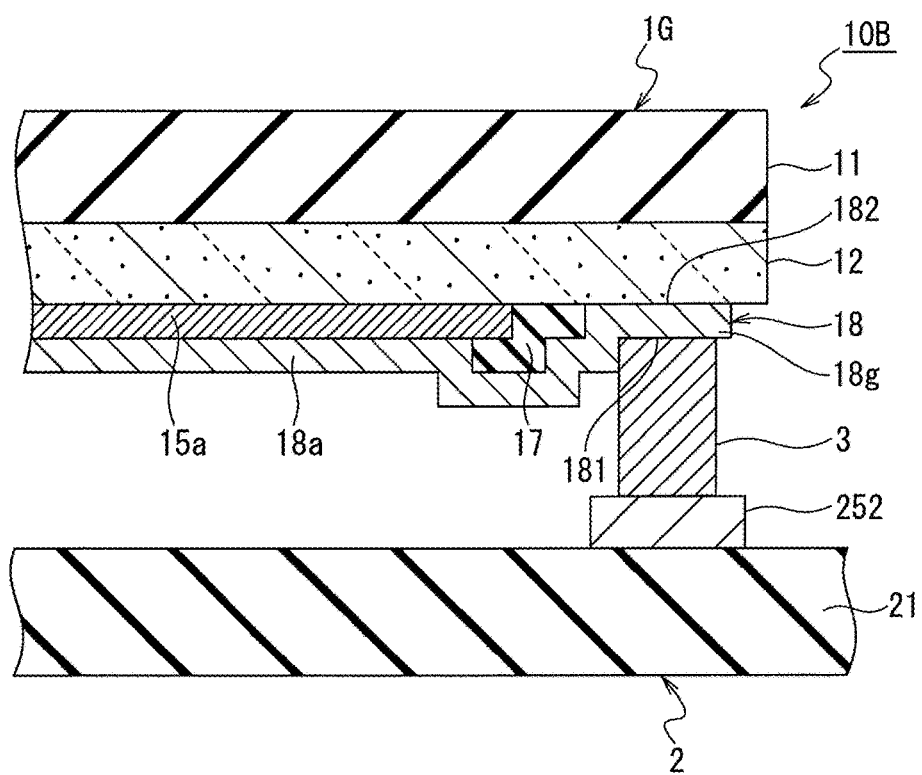
FIG. 23 is a partial cross-sectional view of FIG. 13 in a nitride semiconductor light emitting device of a third embodiment and illustrates a diagram corresponding to the B-B cross-section of FIG. 13.

As illustrated in FIG. 23, in a nitride semiconductor light emitting device 10B of a third embodiment, each reverse side 182 of a site 181 of a wiring layer 18 constituting a semiconductor chip 1G, the site 181 being in contact with one of first connecting bodies 3, is in contact with an n-type nitride semiconductor layer 12. The nitride semiconductor light emitting device 10B of the third embodiment is the same as the nitride semiconductor light emitting device 10 of the first embodiment except the feature described above.

As with the nitride semiconductor light emitting device 10 of the first embodiment, in the nitride semiconductor light emitting device 10B of the third embodiment, an insulating layer 17 exists between belt-shaped portions 18a to 18e and side portions 18f of the wiring layer 18 and the n-type nitride semiconductor layer 12.

That is, the nitride semiconductor light emitting device 10B of the third embodiment is the same as the nitride semiconductor light emitting device 10A of the second embodiment except that "the insulating layer 17 exists between the belt-shaped portions 18a to 18e and the side portions 18f of the wiring layer 18 and the n-type nitride semiconductor layer 12".

Because of this difference, the nitride semiconductor light emitting device 10B of the third embodiment provides an advantageous effect that, even when a crack is generated, originating from a difference in level formed at an electrode end, to the wiring layer 18, the existence of the insulating layer 17 enables moisture and impurities, such as carbon and oxygen, in the air to be suppressed from infiltrating through the crack and the electrodes to be suppressed from being eroded or contaminated, in addition to the same advantageous effects as those of the nitride semiconductor light emitting device 10A of the second embodiment.

Fourth Embodiment

Figure 24:
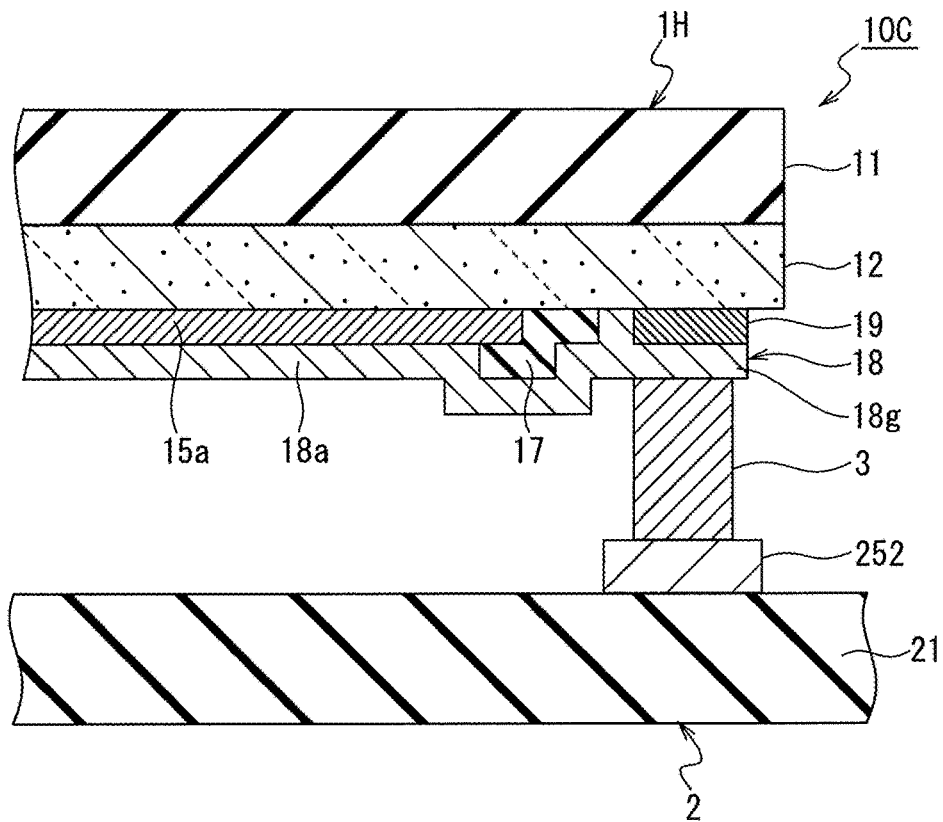
FIG. 24 is a partial cross-sectional view of FIG. 13 in a nitride semiconductor light emitting device of a fourth embodiment and illustrates a diagram corresponding to the B-B cross-section of FIG. 13.

As illustrated in FIG. 24, a nitride semiconductor light emitting device 10C of a fourth embodiment has an adhesion layer 19 between each corner portion (a portion on which one of first connecting bodies is formed) 18g of a wiring layer 18 and an n-type nitride semiconductor layer 12 that constitute a semiconductor chip 1H. The adhesion layer 19 is formed of a material containing Ti.

The nitride semiconductor light emitting device 10C of the fourth embodiment is the same as the nitride semiconductor light emitting device 10B of the third embodiment except the feature described above.

The nitride semiconductor light emitting device 10C of the fourth embodiment provides the same advantageous effects as the nitride semiconductor light emitting device 10B of the third embodiment. In addition, the nitride semiconductor light emitting device 10c of the fourth embodiment, provided with the adhesion layers 19, formed of a material containing Ti, between the corner portions 18g of the wiring layer 18 and the n-type nitride semiconductor layer 12, enables the corner portions 18g of the wiring layer 18 and the n-type nitride semiconductor layer 12 to be joined with each other more easily and solidly than the nitride semiconductor light emitting device 10B of the third embodiment.

Fifth Embodiment

Figure 25:
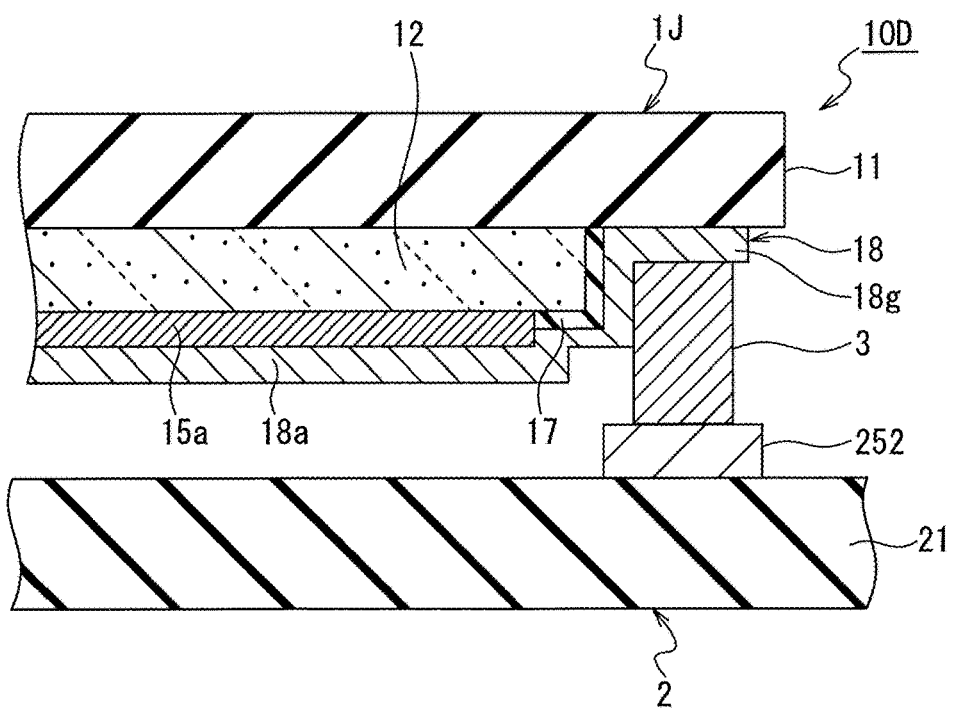
FIG. 25 is a partial cross-sectional view of FIG. 13 in a nitride semiconductor light emitting device of a fifth embodiment and illustrates a diagram corresponding to the B-B cross-section of FIG. 13.

As illustrated in FIG. 25, in a nitride semiconductor light emitting device 10D of a fifth embodiment, each corner portion (a portion on which one of first connecting bodies is formed) 18g of a wiring layer 18 that constitutes a semiconductor chip 1J is formed directly on a substrate 11. That is, the corner portions 18g of the wiring layer 18 exist at positions off an n-type nitride semiconductor layer 12 in plan view.

In addition, an insulating layer 17 is formed between each corner portion 18g of the wiring layer 18 and the n-type nitride semiconductor layer 12. The insulating layer 17 is also formed between a portion where a belt-shaped portion 18a of the wiring layer 18 covers an n-type electrode 15a and the n-type nitride semiconductor layer 12. The insulating layer may be formed between each corner portion 18g of the wiring layer 18 and the substrate 11.

The nitride semiconductor light emitting device 10D of the fifth embodiment is the same as the nitride semiconductor light emitting device 10B of the third embodiment except the features described above.

Because of this difference, the nitride semiconductor light emitting device 10D of the fifth embodiment provides an advantageous effect of enabling current to be suppressed from directly flowing from the wiring layer 18 to the n-type nitride semiconductor layer 12, in addition to the same advantageous effects as those of the nitride semiconductor light emitting device 10B of the third embodiment.

REFERENCE SIGNS LIST

10 Nitride semiconductor light emitting device
1, 1A to 1H, 1J Semiconductor chip (nitride semiconductor light emitting element)
11 Substrate
110 One surface of the substrate (surface on which a first nitride semiconductor layer is formed)
12 N-type nitride semiconductor layer (first nitride semiconductor layer)
125 Edge portion
13 Nitride semiconductor light emitting layer
14 P-type nitride semiconductor layer (second nitride semiconductor layer)
15a N-type electrode (first electrode, first electrode not sandwiched by second electrodes)
15b N-type electrode (first electrode, first electrode sandwiched by second electrodes)
15c N-type electrode (first electrode, first electrode sandwiched by second electrodes)
15d N-type electrode (first electrode, first electrode sandwiched by second electrodes)
15e N-type electrode (first electrode, first electrode not sandwiched by second electrodes)
16a P-type electrode (second electrode)
16b P-type electrode (second electrode)
16c P-type electrode (second electrode)
16d P-type electrode (second electrode)

161a to 161d Projecting portion of a p-type electrode (separating portion)
162a to 162d Portion of a p-type electrode (second electrode) along an n-type electrode (first electrode) next thereto
163a, 163d Separating portion of a p-type electrode (second electrode)
150a to 150e Pad electrode
160a to 160d Pad electrode
17 Insulating layer
18 Wiring layer
18a to 18e Belt-shaped portion of the wiring layer
18f Side portion of the wiring layer
18g Corner portion of the wiring layer (portion on which a first connecting body is formed)
181 Site of the wiring layer in contact with a first connecting body
182 Reverse side of a site of the wiring layer in contact with a first connecting body
2 Package substrate (base body)
25 N-type electrode (third electrode) of the package substrate
252 Connection portion of the n-type electrode of the package substrate
26 P-type electrode (fourth electrode) of the package substrate
262 Connection portion of the p-type electrode of the package substrate
3a to 3d Nitride semiconductor stacked body
3 First connecting body
4 Second connecting body

The invention claimed is:

1. A nitride semiconductor light emitting element comprising:
a first nitride semiconductor layer of a first conductivity type;
nitride semiconductor stacked bodies each of which is formed on a portion of the first nitride semiconductor layer and includes a nitride semiconductor light emitting layer and a second nitride semiconductor layer of a second conductivity type;
a plurality of first electrodes each of which is formed on the first nitride semiconductor layer and extends in a first direction; and
a plurality of second electrodes each of which is formed on one of the second nitride semiconductor layers of the nitride semiconductor stacked bodies and extends in the first direction, wherein
the plurality of first electrodes and the plurality of second electrodes are arranged in parallel with one another with gaps interposed between the plurality of first and second electrodes in a second direction perpendicular to the first direction in plan view,
a first electrode sandwiched by second electrodes and a first electrode not sandwiched by second electrodes exist,
a dimension in the second direction of the first electrode sandwiched by second electrodes is greater than a dimension in the second direction of the first electrode not sandwiched by second electrodes, and
each of the plurality of first electrodes is not directly touching any other of the plurality of first electrodes on the first nitride semiconductor layer.

2. The nitride semiconductor light emitting element according to claim 1, wherein
a dimension in the first direction of the first electrode sandwiched by second electrodes is greater than or equal to a dimension in the first direction of the first electrode not sandwiched by second electrodes.

3. The nitride semiconductor light emitting element according to claim 1, wherein
at least one of the plurality of second electrodes has, at end portions in the first direction of the at least one second electrode, portions the distances of which from one of the plurality of first electrodes arranged next to the at least one second electrode gradually increase toward tips of the at least one second electrode.

4. The nitride semiconductor light emitting element according to claim 3 comprising
an electrode pair of the one of the plurality of first electrodes and one of the plurality of second electrodes arranged next to each other in the second direction, wherein a dimension in the first direction of the one of the plurality of first electrodes is longer than a dimension in the first direction of the one of the plurality of second electrodes, wherein
end portions in the first direction of the one of the plurality of second electrodes in the electrode pair have, on the side of the one of the plurality of second electrodes where the one of the plurality of first electrodes in the electrode pair is located, portions the distances of which from the one of the plurality of first electrodes arranged next to the one of the plurality of second electrodes gradually increase toward tips of the one of the plurality of second electrodes.

5. The nitride semiconductor light emitting element according to claim 1, wherein
the first nitride semiconductor layer has a planar shape of a rectangle,
the first direction and long sides of the rectangle are parallel or substantially parallel with each other, and
the nitride semiconductor light emitting element satisfies at least either the formula (1) below expressing a relationship between a dimension L1 of the long sides of the rectangle and a dimension L2 in the first direction of the first electrode not sandwiched by second electrodes or the formula (2) below expressing a relationship between the dimension L1 of the long sides of the rectangle and a dimension L3 in the first direction of one of the plurality of second electrodes arranged next to the first electrode not sandwiched by second electrodes:

$$140 \ \mu m < L1 - L2 < 650 \ \mu m \quad (1); \text{ and}$$

$$140 \ \mu m < L1 - L3 < 650 \ \mu m \quad (2).$$

6. The nitride semiconductor light emitting element according to claim 1, wherein
the first nitride semiconductor layer has a planar shape of a rectangle,
the first direction and long sides of the rectangle are parallel or substantially parallel with each other, and
an absolute value of a difference between a dimension L2 in the first direction of the first electrode not sandwiched by second electrodes and a dimension L4 in the first direction of the first electrode sandwiched by second electrodes is greater than 0 and less than 500 μm.

7. The nitride semiconductor light emitting element according to claim 1, wherein
the first nitride semiconductor layer has a planar shape of a rectangle,
the first direction and long sides of the rectangle are parallel or substantially parallel with each other, and an absolute value of a difference between a dimension L3 in the first direction of one of the plurality of second electrodes arranged next to the first electrode not sandwiched by second electrodes and a dimension L5 in the first direction of another one of the plurality of second electrodes arranged between the first electrode sandwiched by second electrodes and another first electrode sandwiched by second electrodes is greater than 0 and less than 500 μm.

8. The nitride semiconductor light emitting element according to claim 1, wherein
resistance values between the first electrode not sandwiched by second electrodes and one of the plurality of second electrodes arranged next to the first electrode are practically identical at both end portions and a middle portion in the first direction.

9. A nitride semiconductor light emitting device comprising:
a nitride semiconductor light emitting element according to claim 1 including a wiring layer formed on the plurality of first electrodes;
a base body on which a third electrode and a fourth electrode are formed on surface of the base body facing a surface of the nitride semiconductor light emitting element on which the plurality of first electrodes and the plurality of second electrodes are formed;
a first connecting body configured to electrically connect the wiring layer and the third electrode of the base body to each other; and
second connecting bodies configured to electrically connect the plurality of second electrodes of the nitride semiconductor light emitting element and the fourth electrode of the base body to each other.

10. The nitride semiconductor light emitting device according to claim 9, wherein
the nitride semiconductor light emitting element has an insulating layer formed between the wiring layer and the first nitride semiconductor layer, and
a reverse side of a site of the wiring layer, the site being in contact with the first connecting body, is in contact with the first nitride semiconductor layer or the insulating layer.

11. The nitride semiconductor light emitting device according to claim 10 comprising
an adhesion layer between a portion of the wiring layer on which the first connecting body is formed and the insulating layer.

12. The nitride semiconductor light emitting device according to claim 9, wherein
a reverse side of a site of the wiring layer, the site being in contact with the first connecting body, is in contact with the first nitride semiconductor layer.

13. The nitride semiconductor light emitting device according to claim 9 comprising
an adhesion layer between a portion of the wiring layer on which the first connecting body is formed and the first nitride semiconductor layer.

14. The nitride semiconductor light emitting device according to claim 9, wherein
short diameter x1 in plan view of each of the plurality of first electrodes is smaller than short diameter x2 in plan view of the first connecting body.

15. The nitride semiconductor light emitting device according to claim 9, wherein
a portion of the wiring layer on which the first connecting body is formed exists at a position off the first nitride semiconductor layer in plan view.

16. The nitride semiconductor light emitting device according to claim 9, wherein
the nitride semiconductor light emitting element is an ultraviolet light emitting element emitting ultraviolet light having a wavelength of 360 nm or shorter.

17. The nitride semiconductor light emitting device according to claim 1, wherein
each of the plurality of second electrodes is not connected to any other of the plurality of the second electrodes on the second nitride semiconductor layer.

18. The nitride semiconductor light emitting device according to claim 1, wherein
each of the first electrodes is rectangular in plan view.

19. The nitride semiconductor light emitting device according to claim 18, wherein
each of the second electrodes has, in plan view, two opposed semicircular end portions connected by a straight portion therebetween.

20. The nitride semiconductor light emitting device according to claim 18, wherein
each of the second electrodes is rectangular in plan view.

21. A nitride semiconductor light emitting element comprising:
a first nitride semiconductor layer of a first conductivity type;
nitride semiconductor stacked bodies each of which is formed on a portion of the first nitride semiconductor layer and includes a nitride semiconductor light emitting layer and a second nitride semiconductor layer of a second conductivity type;
a plurality of first electrodes each of which is formed on the first nitride semiconductor layer and extends in a first direction; and
a plurality of second electrodes each of which is formed on one of the second nitride semiconductor layers of the nitride semiconductor stacked bodies and extends in the first direction, wherein
the plurality of first electrodes and the plurality of second electrodes are arranged in parallel with one another with gaps interposed between the plurality of first and second electrodes in a second direction perpendicular to the first direction in plan view,
a first electrode sandwiched by second electrodes and a first electrode not sandwiched by second electrodes exist,
a dimension in the second direction of the first electrode sandwiched by second electrodes is greater than a dimension in the second direction of the first electrode not sandwiched by second electrodes, and
each of the plurality of second electrodes is not connected to any other of the plurality of the second electrodes on the second nitride semiconductor layer.

* * * * *